(12) United States Patent
Itasaka

(10) Patent No.: US 11,929,710 B2
(45) Date of Patent: Mar. 12, 2024

(54) OSCILLATOR

(71) Applicant: SEIKO EPSON CORPORATION, Tokyo (JP)

(72) Inventor: Yosuke Itasaka, Minowa (JP)

(73) Assignee: SEIKO EPSON CORPORATION (JP)

(*) Notice: Subject to any disclaimer, the term of this patent is extended or adjusted under 35 U.S.C. 154(b) by 0 days.

(21) Appl. No.: 18/086,718

(22) Filed: Dec. 22, 2022

(65) Prior Publication Data

US 2023/0208356 A1 Jun. 29, 2023

(30) Foreign Application Priority Data

Dec. 27, 2021 (JP) .................. 2021-211999

(51) Int. Cl.
| | | |
|---|---|---|
| H03B 5/04 | (2006.01) | |
| H03B 5/36 | (2006.01) | |
| H03H 9/05 | (2006.01) | |
| H03H 9/17 | (2006.01) | |
| H03L 1/02 | (2006.01) | |
| H03L 7/099 | (2006.01) | |
| H03L 7/197 | (2006.01) | |

(52) U.S. Cl.
CPC ............ *H03B 5/04* (2013.01); *H03B 5/362* (2013.01); *H03B 5/364* (2013.01); *H03B 5/368* (2013.01); *H03H 9/0547* (2013.01); *H03H 9/17* (2013.01); *H03L 1/023* (2013.01); *H03L 1/027* (2013.01); *H03L 7/099* (2013.01); *H03L 7/1976* (2013.01); *H03B 2200/0038* (2013.01)

(58) Field of Classification Search
CPC .......... H03B 5/04; H03B 5/364; H03B 5/362; H03B 2200/0038; H03B 5/368; H03H 9/17; H03H 9/02102; H03H 9/0547; H03L 7/099; H03L 1/023; H03L 7/1976; H03L 1/027; H03L 1/028
USPC .................................................. 331/158, 176
See application file for complete search history.

(56) References Cited

U.S. PATENT DOCUMENTS

| | | | |
|---|---|---|---|
| 2010/0127787 A1* | 5/2010 | Kurogo | ..................... H03B 5/04 331/158 |
| 2020/0177191 A1* | 6/2020 | Furuya | ................... H03B 5/362 |
| 2020/0274512 A1* | 8/2020 | Uehara | ..................... H03L 7/18 |

FOREIGN PATENT DOCUMENTS

JP 2020-136941 A 8/2020

* cited by examiner

*Primary Examiner* — Arnold M Kinkead
(74) *Attorney, Agent, or Firm* — Harness, Dickey & Pierce, P.L.C.

(57) ABSTRACT

An oscillator includes a resonator, an oscillation circuit, and first and temperature compensation circuits. The first temperature compensation circuit performs a first-order first temperature compensation processing in a first mode and performs the first-order first temperature compensation processing and a high-order first temperature compensation processing in a second mode for a frequency of a first clock signal generated by oscillation of the resonator by the oscillation circuit. The second temperature compensation circuit receives the first clock signal and outputs a second clock signal subjected to a high-order second temperature compensation processing based on the first clock signal.

15 Claims, 15 Drawing Sheets

*FIG. 3*

| OSCILLATOR | MODE | FIRST TEMPERATURE COMPENSATION PROCESSING | CAPACITANCE SENSITIVITY | HEATER CIRCUIT | FREQUENCY TEMPERATURE CHARACTERISTICS | NEAR NOISE | FLOOR NOISE (JITTER) |
|---|---|---|---|---|---|---|---|
| OCXO | FIRST MODE | FIRST-ORDER | LOW | YES | SEVERAL ppb TO SEVERAL TENS OF ppb | ○ | × |
| TCXO | SECOND MODE | FIRST-ORDER AND HIGH-ORDER | HIGH | NO | SEVERAL TENS OF ppb TO SEVERAL HUNDREDS OF ppb | × | × |
| TCXO | FIRST MODE | FIRST-ORDER | LOW | NO | SEVERAL HUNDREDS OF ppb TO SEVERAL ppm | ○ | × |

FIG. 4

| OSCILLATOR | MODE | FIRST TEMPERATURE COMPENSATION PROCESSING | CAPACITANCE SENSITIVITY | HEATER CIRCUIT | JITTER CLEANING CIRCUIT | FREQUENCY TEMPERATURE CHARACTERISTICS | NEAR NOISE | FLOOR NOISE (JITTER) |
|---|---|---|---|---|---|---|---|---|
| OCXO | FIRST MODE | FIRST-ORDER | LOW | YES | × | SEVERAL ppb TO SEVERAL TENS OF ppb | ○ | × |
| OCXO | FIRST MODE | FIRST-ORDER | LOW | YES | ○ | SEVERAL ppb TO SEVERAL TENS OF ppb | ○ | ○ |
| TCXO | SECOND MODE | FIRST-ORDER AND HIGH-ORDER | HIGH | NO | × | SEVERAL TENS OF ppb TO SEVERAL HUNDREDS OF ppb | × | × |
| TCXO | SECOND MODE | FIRST-ORDER AND HIGH-ORDER | HIGH | NO | ○ | SEVERAL TENS OF ppb TO SEVERAL HUNDREDS OF ppb | × | ○ |
| TCXO | FIRST MODE | FIRST-ORDER | LOW | NO | × | SEVERAL HUNDREDS OF ppb TO SEVERAL ppm | ○ | × |
| TCXO | FIRST MODE | FIRST-ORDER | LOW | NO | ○ | SEVERAL HUNDREDS OF ppb TO SEVERAL ppm | ○ | ○ |

OSCILLATOR

The present application is based on, and claims priority from JP Application Serial Number 2021-211999, filed Dec. 27, 2021, the disclosure of which is hereby incorporated by reference herein in its entirety.

BACKGROUND

1. Technical Field

The present disclosure relates to an oscillator and the like.

2. Related Art

In an oscillator that oscillates a resonator such as a quartz crystal resonator, a temperature compensation processing on an oscillation frequency is performed. For example, JP-A-2020-136941 discloses an oscillator including a first circuit device and a second circuit device. The first circuit device generates a first clock signal by oscillating a resonator and performs a first temperature compensation processing of temperature-compensating for a frequency of the first clock signal. The second circuit device receives the first clock signal from the first circuit device, generates a second clock signal based on the first clock signal, and performs a second temperature compensation processing of temperature-compensating for a frequency of the second clock signal. In JP-A-2020-136941, by adopting such a configuration, an oscillator with a reduced frequency micro-jump is implemented.

In the related art in JP-A-2020-136941, most of frequency-temperature characteristics of the resonator are compensated in an oscillation loop by the first circuit device. Therefore, it is necessary to increase a frequency variable sensitivity of an oscillation circuit. There is a concern that phase noise, in particular, near noise of a carrier frequency is deteriorated.

SUMMARY

An aspect of the present disclosure relates to an oscillator including: a resonator; an oscillation circuit configured to oscillate the resonator; a first temperature compensation circuit configured to perform a first temperature compensation processing of temperature-compensating for a frequency of a first clock signal generated by oscillation of the resonator by the oscillation circuit; and a second temperature compensation circuit configured to receive the first clock signal subjected to the first temperature compensation processing, and to output a second clock signal subjected to a second temperature compensation processing based on the first clock signal. The first temperature compensation circuit is configured to perform a first-order first temperature compensation processing as the first temperature compensation processing. The second temperature compensation circuit is configured to perform a high-order second temperature compensation processing as the second temperature compensation processing.

BRIEF DESCRIPTION OF THE DRAWINGS

FIG. 3 is a diagram illustrating mode setting and sensitivity setting of the oscillator.

FIG. 4 is a diagram illustrating the mode setting and the sensitivity setting of the oscillator.

DESCRIPTION OF EXEMPLARY EMBODIMENTS

Hereinafter, the present embodiment will be described. The present embodiment to be described below does not unduly limit contents described in the claims. All configurations described in the present embodiment are not necessarily essential constituent elements.

1. Oscillator

Figure 1:
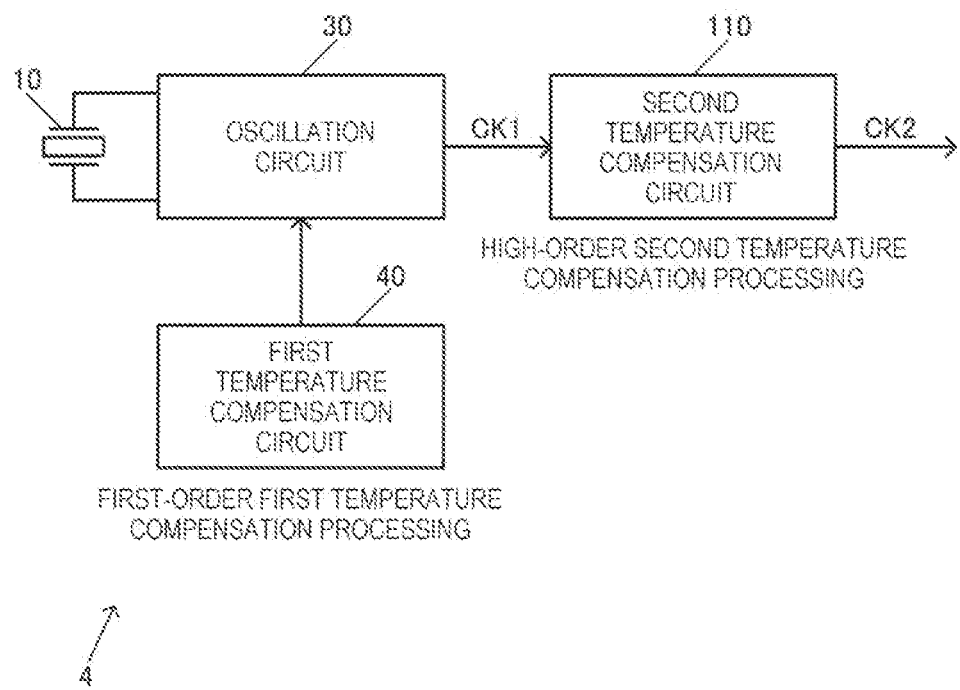
FIG. 1 is a configuration example of an oscillator according to the present embodiment.

FIG. 1 shows a configuration example of an oscillator 4 according to the present embodiment. The oscillator 4 according to the present embodiment includes a resonator 10, an oscillation circuit 30, a first temperature compensation circuit 40, and a second temperature compensation circuit 110.

The resonator 10 is an element that generates mechanical resonation by an electrical signal. The resonator 10 can be implemented by a resonator element such as a quartz crystal resonator element. For example, the resonator 10 can be implemented by a quartz crystal resonator element that has a cut angle of AT cut, SC cut, or the like and that performs thickness-shear resonation, a tuning fork type quartz crystal resonator element, or a double-tuning fork type quartz crystal resonator element. For example, the resonator 10 may be a resonator built in a temperature compensated crystal oscillator (TCXO) not including a thermostatic oven, or may be a resonator built in an oven controlled crystal oscillator (OCXO) including a thermostatic oven. The resonator 10 according to the present embodiment can be implemented by various resonator elements such as a resonator element other than the thickness-shear resonation type, tuning fork type, or double-tuning fork type resonator element, and a piezoelectric resonator element formed of a material other than quartz crystal. For example, a surface acoustic wave (SAW) resonator, or a micro electro mechanical systems (MEMS) resonator as a silicon resonator formed using a silicon substrate may be adopted as the resonator 10.

The oscillation circuit 30 is a circuit that oscillates the resonator 10. For example, the oscillation circuit 30 oscillates the resonator 10 to generate an oscillation signal. The oscillation signal is an oscillation clock signal. For example, the oscillation circuit 30 can be implemented by an oscillation drive circuit electrically coupled to one end and the other end of the resonator 10, and a passive element such as a capacitor or a resistor. The drive circuit can be implemented by, for example, a CMOS inverter circuit or a bipolar transistor. The drive circuit is a core circuit of the oscillation circuit 30, and the drive circuit oscillates the resonator 10 by driving the resonator 10 with a voltage or a current. As the oscillation circuit 30, various types of oscillation circuits such as an inverter type, a Pierce type, a Colpitts type, or a Hartley type can be used. The oscillation circuit 30 is provided with a variable capacitance circuit, and an oscillation frequency can be adjusted by adjusting a capacitance of the variable capacitance circuit. The variable capacitance circuit can be implemented by a variable capacitance element such as a varactor. For example, the variable capacitance circuit can be implemented by a variable capacitance element whose capacitance is controlled based on a temperature compensation voltage. Alternatively, the variable capacitance circuit may be implemented by a capacitor array and a switch array coupled to the capacitor array. In this case, the capacitance of the variable capacitance circuit is controlled by turning on or off a plurality of switches included in the switch array by, for example, a digital control signal. The coupling in the present embodiment is electrical coupling. The electrical coupling is coupling in which electrical signals can be transmitted, and is coupling in which information can be transmitted by the electrical signals. The electrical coupling may be coupling performed via a passive element or the like.

The first temperature compensation circuit 40 performs a first temperature compensation processing. Specifically, the first temperature compensation circuit 40 performs the first temperature compensation processing of temperature-compensating for a frequency of a first clock signal CK1 generated by the oscillation of the resonator 10 by the oscillation circuit 30. The first temperature compensation processing is, for example, a processing of reducing and compensating for a variation in the frequency of the first clock signal CK1 due to a temperature variation. For example, the first temperature compensation processing is an analog temperature compensation processing using an analog temperature compensation circuit. The first clock signal CK1 is a clock signal based on the oscillation signal generated by the oscillation circuit 30 resonating the resonator 10. For example, the oscillation signal generated by the oscillation circuit 30 is waveform-shaped by a waveform shaping circuit to generate a clock signal of a rectangular wave, and a signal obtained by buffering, by an output circuit, the clock signal is output as the first clock signal CK1 to the second temperature compensation circuit 110.

The second temperature compensation circuit 110 performs a second temperature compensation processing. Specifically, the second temperature compensation circuit 110 receives the first clock signal CK1 subjected to the first temperature compensation processing, and outputs a second clock signal CK2 subjected to the second temperature compensation processing based on the first clock signal CK1. The second temperature compensation processing is, for example, a processing of reducing and compensating for the variation in the frequency of the second clock signal CK2 due to the temperature variation. For example, the second temperature compensation processing is a digital temperature compensation processing using a digital circuit. The second clock signal CK2 output from the second temperature compensation circuit 110 may have a frequency different from that of the first clock signal CK1 or may have a frequency same as that of the first clock signal CK1.

The first temperature compensation circuit 40 performs a first-order first temperature compensation processing as the first temperature compensation processing. On the other hand, the second temperature compensation circuit 110 performs a high-order second temperature compensation processing as the second temperature compensation processing.

For example, the first temperature compensation circuit 40 performs, as the first temperature compensation processing, a processing of compensating for frequency-temperature characteristics other than the frequency-temperature characteristics of the resonator 10. For example, the first temperature compensation circuit 40 performs the temperature compensation processing on frequency-temperature characteristics of circuit elements provided in the oscillation circuit 30 as the frequency-temperature characteristics other than the frequency-temperature characteristics of the resonator 10. The circuit element is an active element such as a transistor, or a passive element such as a resistor and a capacitor. As the processing of compensating for the frequency-temperature characteristics other than the frequency-temperature characteristics of the resonator 10, the first-order temperature compensation processing is suitable.

On the other hand, the second temperature compensation circuit 110 performs the high-order second temperature compensation processing in order to mainly compensate for the frequency-temperature characteristics of the resonator 10. The second temperature compensation circuit 110 may perform at least the high-order second temperature compensation processing, and may also perform the first-order second temperature compensation processing. For example, when the resonator 10 has high-order frequency-temperature characteristics such as third-order or fifth-order frequency-temperature characteristics, the second temperature compensation circuit 110 performs the second temperature compensation processing of compensating for the high-order frequency-temperature characteristics. For example, the second temperature compensation circuit 110 performs, as the second temperature compensation processing, a processing of temperature-compensating for the remaining frequency-temperature characteristics that cannot be temperature-compensated by the first temperature compensation processing performed by the first temperature compensation circuit 40. For example, when the resonator 10 has high-order frequency-temperature characteristics, the high-order frequency-temperature characteristics of the resonator 10 remains without being temperature-compensated in the first-order first temperature compensation processing of the first temperature compensation circuit 40, and the second temperature compensation circuit 110 performs the second temperature compensation processing of temperature-compensating for the remaining frequency-temperature characteristics. For example, the second temperature compensation circuit 110 performs, on the first clock signal CK1 after the first temperature compensation processing of the first temperature compensation circuit 40, the second temperature compensation processing of making the frequency-temperature characteristics of the second clock signal CK2 fall within a range of a required specification of the oscillator 4. The expression "making the frequency-temperature characteristics of the second clock signal CK2 fall within a range of a required specification" means that a frequency change in the second clock signal CK2 in, for example, an operating temperature range of the oscillator 4 is equal to or less than a specified value.

For example, in the related art in JP-A-2020-136941 described above, most of frequency-temperature characteristics of the resonator are compensated in an oscillation loop by the first circuit device. Therefore, for example, it is necessary to increase the frequency variable sensitivity of the oscillation circuit. There is a concern that phase noise, particularly, near noise of a carrier frequency, increases, and noise characteristics deteriorate. On the other hand, when a temperature compensation amount in the second circuit device is increased, accuracy of the micro-jump or the frequency-temperature characteristics is limited by resolution of digital temperature compensation. Thus, there is a trade-off relationship between the near noise and the frequency-temperature characteristics.

In this regard, in the present embodiment, the first temperature compensation circuit 40 performs the first-order first temperature compensation processing. Therefore, the first temperature compensation circuit 40 does not need to perform the high-order temperature compensation processing, and phase noise such as near noise of the carrier frequency caused by the high-order temperature compensation processing in the first temperature compensation circuit 40 can be reduced, so that deterioration in noise characteristics can be prevented. On the other hand, since the second temperature compensation circuit 110 performs the high-order second temperature compensation processing, it is possible to temperature-compensate for the remaining high-order frequency-temperature characteristics that cannot be temperature-compensated by the first-order first temperature compensation processing of the first temperature compensation circuit 40. For example, the frequency-temperature characteristics of the circuit elements of the oscillation circuit 30 can be temperature-compensated by the first-order first temperature compensation processing of the first temperature compensation circuit 40, and the high-order frequency-temperature characteristics of the resonator 10 can be temperature-compensated by the high-order second temperature compensation processing of the second temperature compensation circuit 110. Therefore, the frequency-temperature characteristics of the second clock signal CK2 can be set within the range of the required specification, and the oscillator 4 capable of reducing phase noise such as near noise can be implemented.

Figure 2:
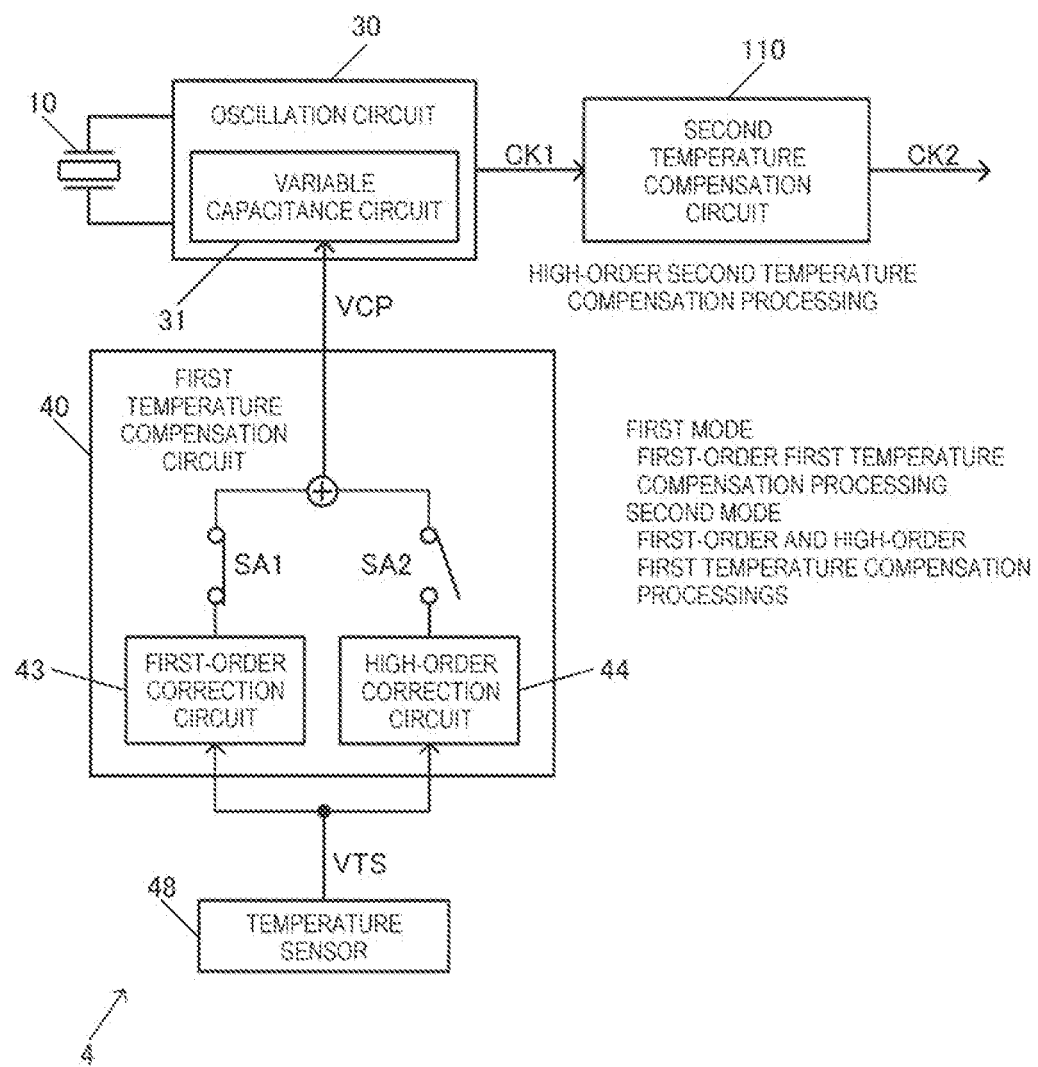
FIG. 2 is a detailed configuration example of the oscillator according to the present embodiment.

FIG. 2 shows a detailed configuration example of the oscillator 4 according to the present embodiment. In a first mode, the first temperature compensation circuit 40 of the oscillator 4 in FIG. 2 performs the first-order first temperature compensation processing as the first temperature compensation processing. In a second mode, the first temperature compensation circuit 40 performs the first-order first temperature compensation processing and a high-order first temperature compensation processing as the first temperature compensation processing.

Specifically, as shown in FIG. 2, the first temperature compensation circuit 40 includes a first-order correction circuit 43 and a high-order correction circuit 44. The first-order correction circuit 43 performs the first-order temperature compensation processing. The high-order correction circuit 44 performs the high-order temperature compensation processing. The first-order correction circuit 43 and the high-order correction circuit 44 will be described in detail later with reference to FIG. 11. In the first mode, for example, when a switch SA1 is turned on and a switch SA2 is turned off, the first temperature compensation circuit 40 performs the first-order first temperature compensation processing by the first-order correction circuit 43. On the other hand, in the second mode, for example, when both the switch SA1 and the switch SA2 are turned on, the first temperature compensation circuit 40 performs the first-order first temperature compensation processing by the first-order correction circuit 43 and the high-order first temperature compensation processing by the high-order correction circuit 44.

In this way, for example, when a priority is given to reduction of phase noise, the oscillator 4 is set to the first mode. Accordingly, the first temperature compensation circuit 40 performs the first-order first temperature compensation processing and outputs the first clock signal CK1, and the second temperature compensation circuit 110 performs the high-order second temperature compensation processing based on the first clock signal CK1 subjected to the first-order first temperature compensation processing and outputs the second clock signal CK2. In this way, the temperature compensation on the frequency-temperature characteristics of the circuit elements of the oscillation circuit 30 is performed by the first-order first temperature compensation processing of the first temperature compensation circuit 40. In the first mode, the high-order correction circuit 44 is not coupled, so that the phase noise such as the near noise caused by noise generated by the high-order correction circuit 44 can be reduced. Further, the high-order frequency-temperature characteristics of the resonator 10, which cannot be temperature-compensated by the first-order first temperature compensation processing of the first temperature compensation circuit 40, is temperature-compensated by the high-order second temperature compensation processing of the second temperature compensation circuit 110.

On the other hand, when a priority is given to improvement in the frequency-temperature characteristics over the reduction of the phase noise, the oscillator 4 is set to the second mode. Accordingly, the first temperature compensation circuit 40 performs the first-order first temperature compensation processing and the high-order first temperature compensation processing and outputs the first clock signal CK1. The second temperature compensation circuit 110 performs the high-order second temperature compensation processing based on the first clock signal CK1 subjected to the first-order first temperature compensation processing and the high-order first temperature compensation processing and outputs the second clock signal CK2. According to the second mode, the phase noise such as the near noise caused by the noise generated by the high-order correction circuit 44 or the like increases. However, the high-order frequency-temperature characteristics of the resonator 10 can be temperature-compensated by both the first temperature compensation processing of the first temperature compensation circuit 40 and the second temperature compensation processing of the second temperature compensation circuit 110, and a stricter specification requirement for the frequency-temperature characteristics can be satisfied. In this way, in FIG. 2, the first temperature compensation circuit 40 can switch between the first mode in which the first-order first temperature compensation processing is performed and the second mode in which the first-order first temperature compensation processing and the high-order first temperature compensation processing are performed. Accordingly, when the priority is given to the reduction of the phase noise, the oscillator 4 can be set to the first mode. When the priority is given to the improvement in the frequency-temperature characteristics, the oscillator 4 can be set to the second mode. Therefore, it is possible to implement the oscillator 4 capable of coping with both the case where the priority is given to the reduction of the phase noise and the case where the priority is given to the improvement in the frequency-temperature characteristics. The first temperature compensation circuit 40 having the same configuration can be used for the oscillator 4 set to the first mode with the priority given to the reduction of the phase noise and the oscillator 4 set to the second mode with the priority given to the improvement in the frequency-temperature characteristics. Therefore, a design period of the circuit can be shortened, and a cost can be reduced.

Next, the configuration of the oscillator 4 in FIG. 2 will be described in more detail. In FIG. 2, the oscillator 4 is provided with a temperature sensor 48. The temperature sensor 48 is a sensor that detects a temperature. Specifically, the temperature sensor 48 outputs, as a temperature detection voltage VTS, a temperature dependent voltage that changes according to an environmental temperature. For example, the temperature sensor 48 generates the temperature detection voltage VTS, which is a temperature detection signal, by using a circuit element having temperature dependency. Specifically, the temperature sensor 48 outputs the temperature detection voltage VTS whose voltage changes depending on the temperature by using, for example, the temperature dependency of a forward voltage of a PN junction. A modification in which a digital temperature sensor circuit is used as the temperature sensor 48 is also possible. In this case, the temperature detection voltage VTS may be generated by performing D/A conversion on temperature detection data.

The first-order correction circuit 43 of the first temperature compensation circuit 40 receives the temperature detection voltage VTS from the temperature sensor 48 and performs the first-order temperature compensation processing. The high-order correction circuit 44 of the first temperature compensation circuit 40 receives the temperature detection voltage VTS from the temperature sensor 48 and performs the high-order temperature compensation processing. For example, in the second mode, a first-order correction current generated by the first-order correction circuit 43 based on the temperature detection voltage VTS and a high-order correction current generated by the high-order correction circuit 44 based on the temperature detection voltage VTS are added, the current obtained by addition is converted into a voltage, and the voltage is output as a temperature compensation voltage VCP.

The oscillation circuit 30 includes a variable capacitance circuit 31. The variable capacitance circuit 31 includes a variable capacitance element such as a varactor. For example, a MOS type variable capacitance element is a capacitance element in which a source and a drain of a metal oxide semiconductor (MOS) transistor are short-circuited, and an electrostatic capacitance generated between the short-circuited source and drain and a gate is variably controlled by the temperature compensation voltage VCP which is a capacitance control voltage. The MOS type variable capacitance element is also referred to as a MOS varactor. Further, the capacitance of the variable capacitance circuit 31 is variably adjusted by controlling the capacitance of the variable capacitance element based on the temperature compensation voltage VCP from the first temperature compensation circuit 40. By adjusting the capacitance of the variable capacitance circuit 31, the oscillation frequency of the oscillation circuit 30 is adjusted, and the temperature compensation processing is implemented.

As described above, in FIG. 2, the oscillation circuit 30 includes the variable capacitance circuit 31. The first temperature compensation circuit 40 outputs, to the variable capacitance circuit 31, the temperature compensation voltage VCP based on a temperature detection result of the temperature sensor 48. In this way, the first temperature compensation circuit 40 outputs the temperature compensation voltage VCP corresponding to the temperature detection result such as the temperature detection voltage VTS from the temperature sensor 48, so that the capacitance of the variable capacitance circuit 31 of the oscillation circuit 30 is changed, and the first temperature compensation processing on the first clock signal CK1 based on the oscillation signal of the oscillation circuit 30 can be implemented.

The first temperature compensation circuit 40 performs analog temperature compensation by polynomial approximation, for example. For example, when the temperature compensation voltage VCP for compensating for the frequency-temperature characteristics of the resonator 10 is approximated by a polynomial, the first temperature compensation circuit 40 performs the analog temperature compensation based on coefficient information on the polynomial in the second mode in which the first-order first temperature compensation processing and the high-order first temperature compensation processing are performed. The analog temperature compensation is, for example, temperature compensation implemented by an addition processing on a current signal or a voltage signal which is an analog signal. For example, when the temperature compensation voltage VCP is approximated by a high-order polynomial, a zero-order coefficient, a first-order coefficient, and a high-order coefficient of the polynomial are respectively stored as zero-order correction data, first-order correction data, and high-order correction data in a storage circuit implemented by, for example, a nonvolatile memory. The high-order coefficient is, for example, a coefficient of an order higher than the first order. The high-order correction data is correction data corresponding to the high-order coefficient. For example, when the temperature compensation voltage VCP is approximated by a third-order polynomial, a zero-order coefficient, a first-order coefficient, a second-order coefficient, and a third-order coefficient of the polynomial are stored in the storage circuit as zero-order correction data, first-order correction data, second-order correction data, and third-order correction data. In the second mode, the first temperature compensation circuit 40 performs the first temperature compensation processing based on the zero-order correction data to the third-order correction data. In this case, the second-order correction data and the temperature compensation based on the second-order correction data may be omitted. For example, when the temperature compensation voltage VCP is approximated by a fifth-order polynomial, a zero-order coefficient, a first-order coefficient, a second-order coefficient, a third-order coefficient, a fourth-order coefficient, and a fifth-order coefficient of the polynomial are stored in the storage circuit as zero-order correction data, first-order correction data, second-order correction data, third-order correction data, fourth-order correction data, and fifth-order correction data. In the second mode, the first temperature compensation circuit 40 performs the first temperature compensation processing based on the zero-order correction data to the fifth-order correction data. In this case, the second-order correction data or the fourth-order correction data, and the temperature compensation based on the second-order correction data or the fourth-order correction data may be omitted. The order of polynomial approximation may be any order. For example, polynomial approximation of an order higher than the fifth order may be performed. The zero-order correction may be performed by the temperature sensor 48.

In the present embodiment, the oscillator 4 is set to the first mode when used as a oven controlled oscillator that controls the temperature of the resonator 10. For example, when the oscillator is used as the oven controlled oscillator including the thermostatic oven, the oscillator is set to the first mode. On the other hand, when the oscillator 4 is used as the temperature compensated oscillator that does not control the temperature of the resonator 10, the oscillator 4 is set to the first mode or the second mode. For example, the oscillator 4 is set to the first mode or the second mode when the oscillator is used as the temperature compensated oscillator that does not include a thermostatic oven. In the following description, for simplification of the description, the oven controlled oscillator that controls the temperature of the resonator 10 is appropriately referred to as an OCXO, and the temperature compensated oscillator that does not control the temperature of the resonator 10 is appropriately referred to as a TCXO.

Figure 15:
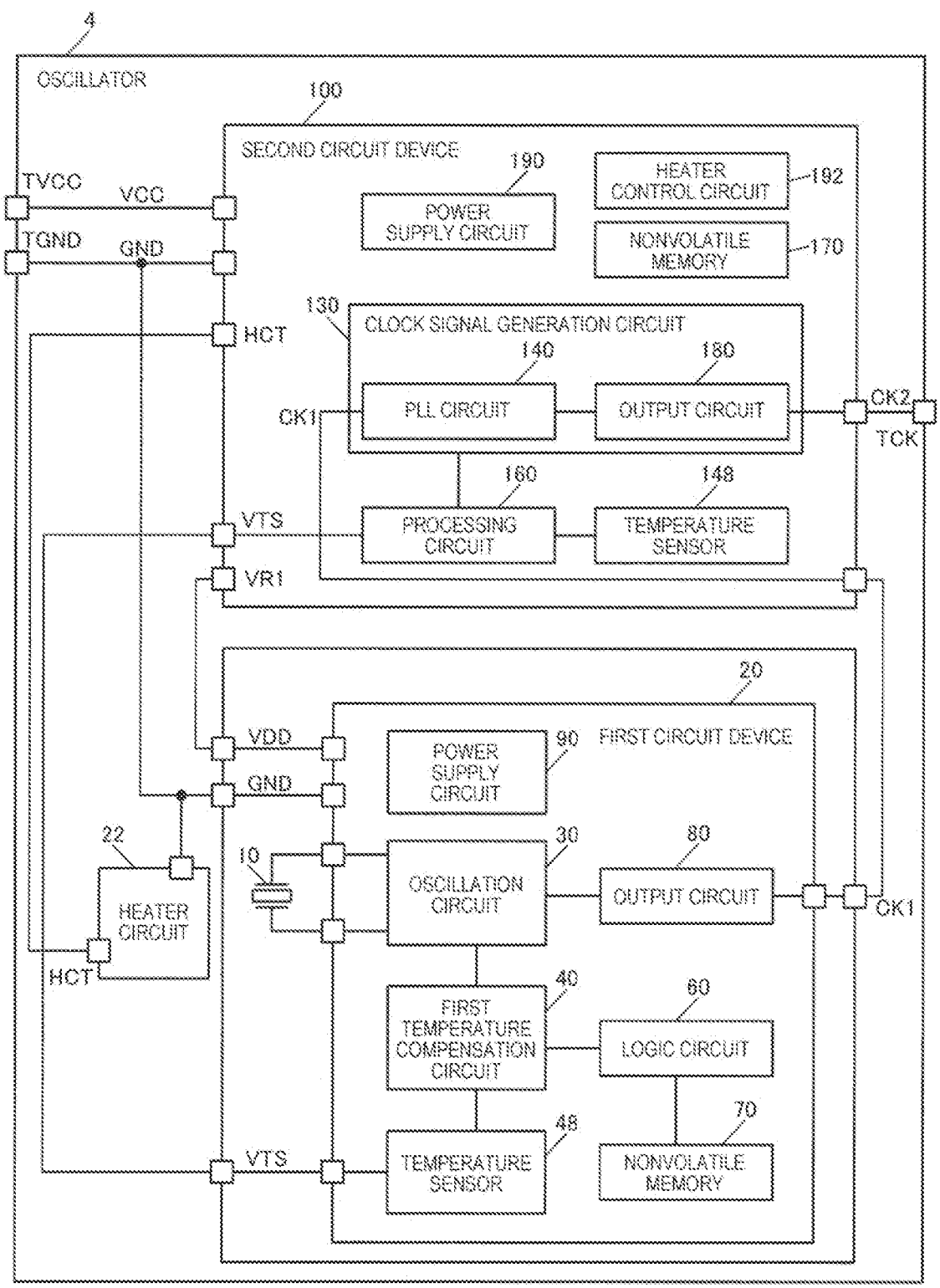
FIG. 15 is another configuration example of the oscillator including the first circuit device and the second circuit device.

FIG. 3 is a diagram illustrating mode setting and sensitivity setting of the oscillator 4. As shown in FIG. 3, when the oscillator 4 is used as the OCXO which is the oven controlled oscillator that controls the temperature of the resonator 10, the oscillator 4 is set to the first mode. Therefore, the first temperature compensation circuit 40 performs the first-order first temperature compensation processing. The second temperature compensation circuit 110 performs the high-order second temperature compensation processing. In the OCXO, a heater circuit 22 described later with reference to FIG. 15 is provided in the oscillator 4, and the temperature of the resonator 10 is kept constant by the heater circuit 22. Therefore, the frequency-temperature characteristics are improved, and a frequency change in the operating temperature range can be made very small, such as several ppb to several tens of ppb. When the oscillator 4 is used as the OCXO, the oscillator 4 is set to the first mode, whereby the first temperature compensation circuit 40 does not perform the high-order first temperature compensation processing. Therefore, the near noise can be reduced as shown in FIG. 3, and the noise characteristics can be improved. Therefore, when the oscillator 4 is used as the OCXO, the oscillator 4 is set to the first mode, whereby the frequency-temperature characteristics can be improved and the noise characteristics can also be improved.

As shown in FIG. 3, when the oscillator 4 is used as the TCXO that is the temperature compensated oscillator that does not control the temperature of the resonator 10, the oscillator 4 is set to the first mode or the second mode. For example, when the oscillator 4 is used as the TCXO and the oscillator 4 is set to the first mode, the first temperature compensation circuit 40 performs the first-order first temperature compensation processing, and the second temperature compensation circuit 110 performs the high-order second temperature compensation processing. Accordingly, as shown in FIG. 3, for the frequency-temperature characteristics, the frequency change in the operating temperature range is several hundreds of ppb to several ppm, and the near noise is reduced and the noise characteristics can be improved. On the other hand, when the oscillator 4 is used as the TCXO and the oscillator 4 is set to the second mode, the first temperature compensation circuit 40 performs the first-order first temperature compensation processing and the high-order first temperature compensation processing, and the second temperature compensation circuit 110 performs the high-order second temperature compensation processing. Accordingly, as shown in FIG. 3, for the frequency-temperature characteristics, the frequency change in the operating temperature range is several tens of ppb to several hundreds of ppb, which can be improved as compared with the first mode. On the other hand, the near noise increases, and the noise characteristics deteriorate as compared with the first mode. In this way, when the oscillator 4 is used as the TCXO, the oscillator 4 is set to the first mode or the second mode. When the priority is given to the improvement in the noise characteristics, the oscillator 4 can be set to the first mode to deal with, and when the priority is given to the improvement in the frequency-temperature characteristics, the oscillator 4 can be set to the second mode to deal with.

For example, when the oscillator 4 is set to the second mode and the first temperature compensation circuit 40 performs the first-order first temperature compensation processing and the high-order first temperature compensation processing, the first temperature compensation processing for coarse adjustment is performed. Accordingly, a frequency variation amount in the frequency-temperature characteristics of the first clock signal CK1 output from the first temperature compensation circuit 40 is reduced. Further, when the second temperature compensation circuit 110 generates the second clock signal CK2 based on the first clock signal CK1 from the first temperature compensation circuit 40, the second temperature compensation circuit 110 performs the second temperature compensation processing, which is a temperature compensation processing for fine adjustment. In this way, after the first temperature compensation processing for coarse adjustment is performed by the first temperature compensation circuit 40, the second temperature compensation processing for fine adjustment is performed by the second temperature compensation circuit 110. Therefore, the micro-jump in the frequency caused by the fluctuation of a temperature measurement result or the like can be reduced, and high accuracy of a clock frequency of the oscillator 4 can be achieved.

When the oscillator 4 is used as the TCXO, the heater circuit 22 is not provided and the temperature of the resonator 10 cannot be kept constant. Therefore, as compared with the case of being used as the OCXO, the frequency-temperature characteristics deteriorate, and the frequency change in the operating temperature range increases.

In the present embodiment, as shown in FIG. 3, the capacitance sensitivity of the variable capacitance circuit 31 in FIG. 2 with respect to the temperature compensation voltage VCP is set to be lower in the first mode than in the second mode. The capacitance sensitivity is a sensitivity of a change in capacitance of the variable capacitance circuit 31 with respect to the temperature compensation voltage VCP which is the capacitance control voltage. A frequency voltage sensitivity of the oscillation frequency in the oscillation circuit 30 is set according to the capacitance sensitivity. For example, as will be described later with reference to FIG. 13, the variable capacitance circuit 31 can variably set the capacitance sensitivity with respect to the temperature compensation voltage VCP. Therefore, in the first mode, by setting the capacitance sensitivity of the variable capacitance circuit 31 to a low sensitivity, the change in the oscillation frequency with respect to the change in the temperature compensation voltage VCP is reduced. On the other hand, in the second mode, by setting the capacitance sensitivity of the variable capacitance circuit 31 to a high sensitivity, the change in the oscillation frequency with respect to the change in the temperature compensation voltage VCP is increased.

For example, when the capacitance sensitivity of the variable capacitance circuit 31 increases, the change in the oscillation frequency of the oscillation circuit 30 with respect to the change in the temperature compensation voltage VCP increases. Further, since noise such as thermal noise or flicker noise generated by the circuit elements constituting the first temperature compensation circuit 40 is also superimposed on the temperature compensation voltage VCP output from the first temperature compensation circuit 40, the noise is amplified by the high capacitance sensitivity of the variable capacitance circuit 31. Therefore, the oscillation frequency varies depending on the noise, and the noise characteristics deteriorate. Therefore, in the first mode in which the priority is given to the improvement in the noise characteristics, as shown in FIG. 3, the capacitance sensitivity of the variable capacitance circuit 31 is set to a low sensitivity. Accordingly, the noise of the circuit elements constituting the first temperature compensation circuit 40 is amplified, so that the oscillation frequency can be prevented from varying due to the noise, and the deterioration in the noise characteristics can be prevented.

As shown in FIG. 3, a situation of floor noise cannot be improved when the oscillator 4 is used as the OCXO and is set to the first mode or when the oscillator 4 is used as the TCXO and is set to the first mode or the second mode. Therefore, in the present embodiment, for example, as will be described in detail later with reference to FIG. 16, a jitter cleaning circuit 150 for performing jitter cleaning on the second clock signal CK2 is provided. By providing the jitter cleaning circuit 150, as shown in FIG. 4, jitter noise can be reduced and the floor noise can also be reduced, so that the noise characteristics can be further improved.

Figure 5:
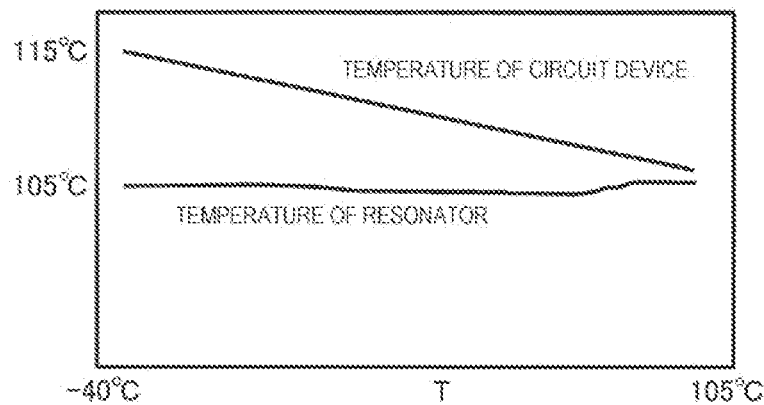
FIG. 5 is a diagram showing a relationship between a temperature of a circuit device and a temperature of a resonator.

Next, the OCXO will be described in detail. For example, when the oscillator 4 is used as the OCXO, the heater circuit 22 is provided in the oscillator 4, as shown in FIG. 15 to be described later. By providing the heater circuit 22, as shown in FIG. 5, the temperature of the resonator 10 can be set to a constant temperature such as 105° C. In FIG. 5, a horizontal axis represents an ambient atmosphere temperature. In the case in FIG. 5, the temperature of the circuit device changes according to the atmosphere temperature.

Figure 6:
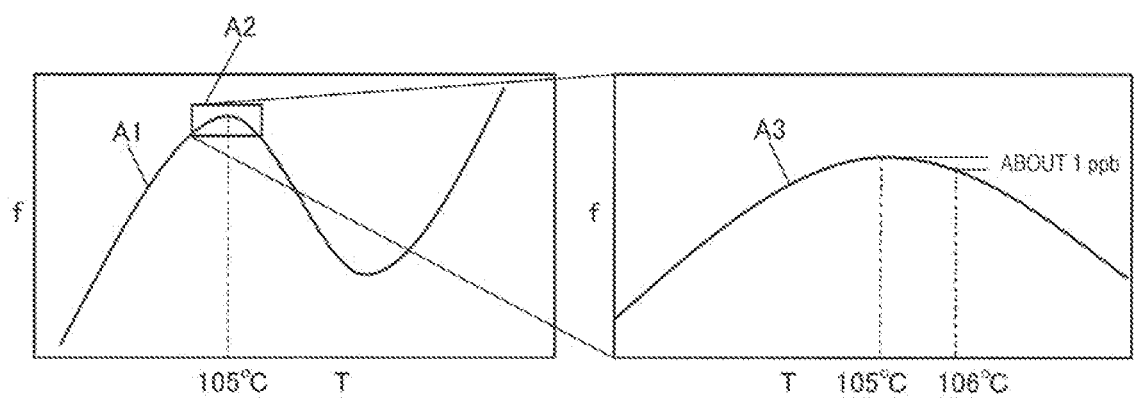
FIG. 6 is diagram illustrating a temperature compensation processing in an OCXO.

In the OCXO, the resonator 10 such as an SC cut resonator having frequency-temperature characteristics as indicated by A1 in FIG. 6 is used. In the frequency-temperature characteristics of the SC cut resonator 10 in FIG. 6, a frequency f has a maximum value at 105° C. Then, the heater circuit 22 performs temperature control to keep the temperature of the resonator 10 at 105° C. Therefore, as in frequency-temperature characteristics indicated by A3 obtained by enlarging a portion of A2 in FIG. 6, the frequency-temperature characteristics are second-order characteristics. For example, in the SC cut resonator 10, as indicated by A3 in FIG. 6, a frequency variation in a range of 105° C. to 106° C. is about 1 ppb. Therefore, when the temperature variation of the resonator 10 is reduced to, for example, the range of 105° C. to 106° C. by the heater circuit 22, it is possible to reduce the frequency variation caused by the frequency-temperature characteristics of the resonator 10 to about 1 ppb.

Figure 7:
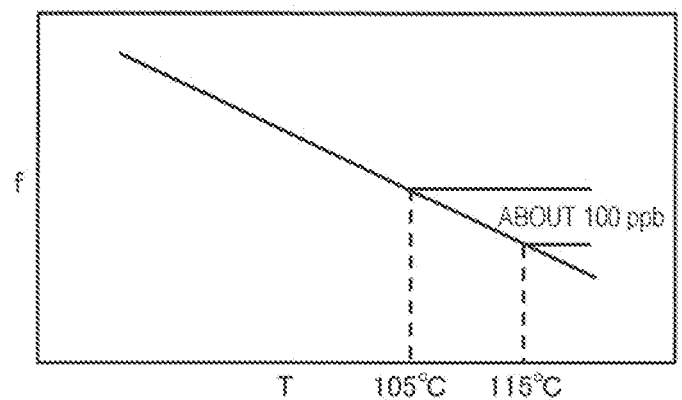
FIG. 7 is an example of frequency-temperature characteristics of circuit elements of an oscillation circuit.

When the oscillator 4 is used as the OCXO and is set to the first mode, the second temperature compensation circuit 110 performs the second temperature compensation processing of temperature-compensating for the second-order frequency-temperature characteristics in FIG. 6. In this case, when the first-order frequency-temperature characteristics of the circuit elements of the oscillation circuit 30 remain in the first clock signal CK1, the second-order frequency-temperature characteristics indicated by A3 in FIG. 6 is inclined due to the first-order frequency-temperature characteristics, and the frequency variation becomes large. In this regard, in the present embodiment, as shown in FIGS. 3 and 4, when the oscillator 4 is used as the OCXO, the oscillator 4 is set to the first mode, and the first temperature compensation circuit 40 performs the first-order first temperature compensation processing. By the first-order first temperature compensation processing of the first temperature compensation circuit 40, the first-order frequency-temperature characteristics of the circuit elements of the oscillation circuit 30 are temperature-compensated, and the first-order frequency-temperature characteristics remaining in the first clock signal CK1 can be reduced. For example, as shown in FIG. 7, the first-order frequency-temperature characteristics of the circuit elements of the oscillation circuit 30 have a frequency variation of about 100 ppb between 105° C. and 115° C. The frequency-temperature characteristics can be compensated by the first-order first temperature compensation processing of the first temperature compensation circuit 40. Accordingly, it is possible to prevent the secondary frequency-temperature characteristics in FIG. 6 from being inclined due to the first-order frequency-temperature characteristics, and it is possible to prevent an increase in the frequency variation caused by the first-order frequency-temperature characteristics of the circuit elements of the oscillation circuit 30.

Figure 8:
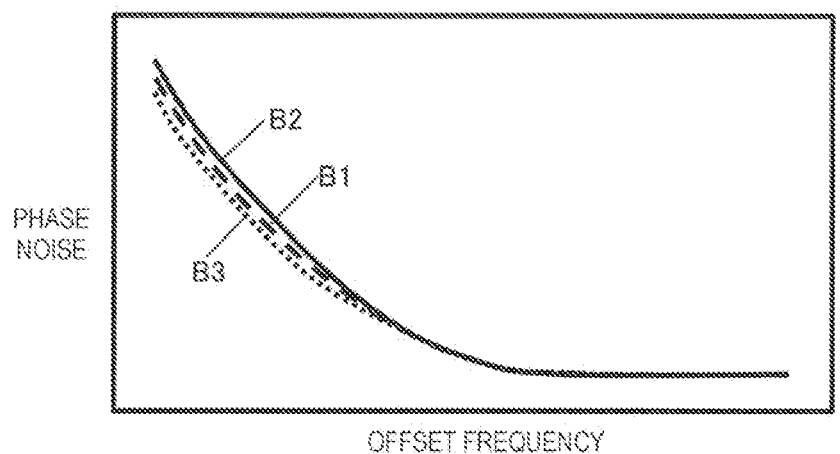
FIG. 8 is a diagram illustrating phase noise characteristics.

FIG. 8 is a diagram showing the influence of the temperature compensation processing and the capacitance sensitivity on the phase noise. B1 in FIG. 8 is a phase noise characteristic when the oscillator 4 is set to the first mode and the first temperature compensation circuit 40 performs the first-order first temperature compensation processing. B2 in FIG. 8 is a phase noise characteristic when the oscillator 4 is set to the second mode and the first temperature compensation circuit 40 performs the first-order first temperature compensation processing and the high-order first temperature compensation processing. By setting the oscillator 4 to the first mode and causing the first temperature compensation circuit 40 to perform only the first-order first temperature compensation processing as indicated by B1, the phase noise can be reduced as compared with the case where the oscillator 4 is set to the second mode and the first-order first temperature compensation processing and the high-order first temperature compensation processing are performed as indicated by B2.

B3 in FIG. 8 is a phase noise characteristic when the oscillator 4 is set to the first mode and the capacitance sensitivity of the variable capacitance circuit 31 is set to a low sensitivity. In this way, the oscillator 4 is set to the first mode, the first temperature compensation circuit 40 is caused to perform the first-order first temperature compensation processing, and the capacitance sensitivity of the variable capacitance circuit 31 is set to a low sensitivity. Therefore, the phase noise can be reduced as compared with B1 and B2.

Figure 9:
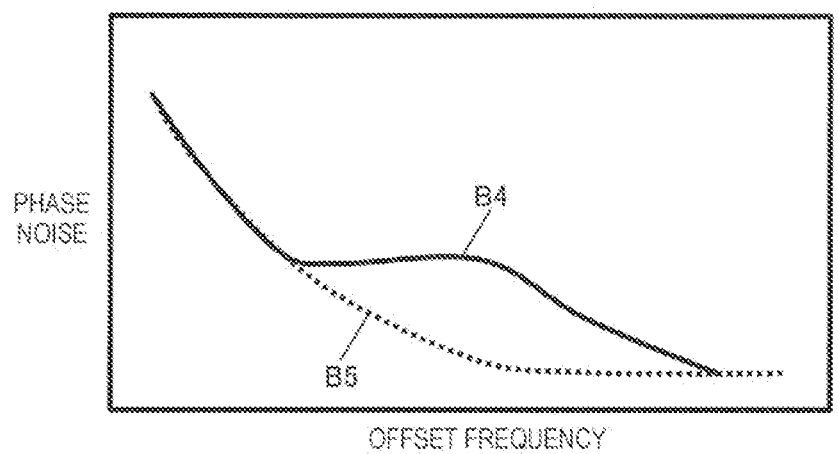
FIG. 9 is a diagram illustrating the phase noise characteristics.

FIG. 9 is a diagram illustrating an effect of the jitter cleaning circuit 150 to be described later with reference to FIG. 16. B4 in FIG. 9 is a phase noise characteristic when the jitter cleaning circuit 150 is not used. B5 in FIG. 9 is a phase noise characteristic when the jitter cleaning circuit 150 is used. As shown in B5, by using the jitter cleaning circuit 150, it is possible to reduce the floor noise, which is high-frequency noise, and to reduce the floor noise on a jitter cleaning circuit 150 side, for example.

Figure 10:
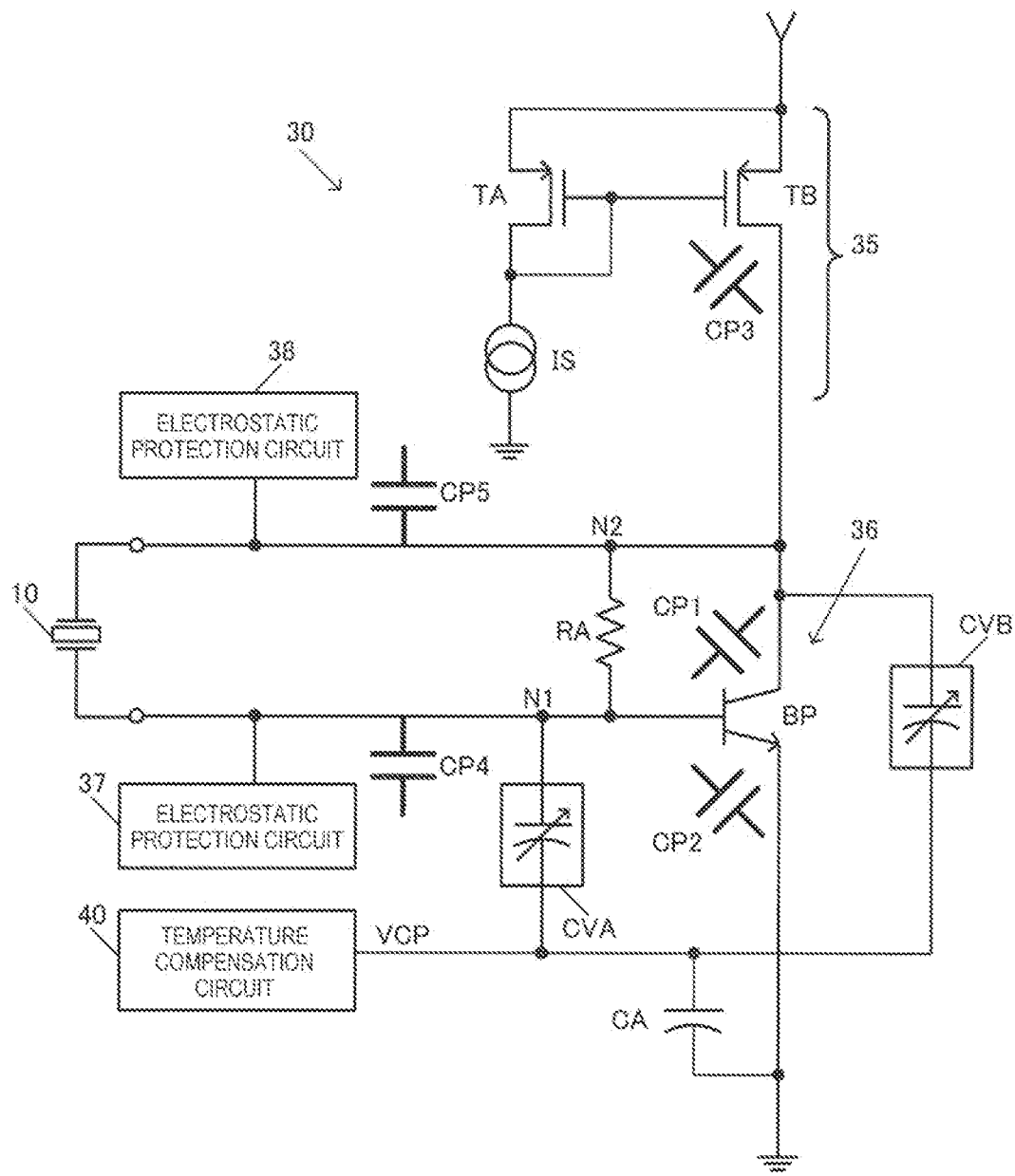
FIG. 10 is a diagram illustrating the frequency-temperature characteristics of the circuit elements of the oscillation circuit.

FIG. 10 is a diagram illustrating the frequency-temperature characteristics of circuit elements of the oscillation circuit 30. As shown in FIG. 10, the oscillation circuit 30 includes a drive circuit 36 that drives the resonator 10 and a current source circuit 35 that supplies a current to the drive circuit 36. The drive circuit 36 includes a bipolar transistor BP in which a node N1 on one end side of the resonator 10 is coupled to a base and a node N2 on the other end side of the resonator 10 is coupled to a collector. An emitter of the bipolar transistor BP is coupled to a GND node. The current source circuit 35 includes P-type transistors TA and TB that are current-mirror coupled to each other, and a current source IS. In FIG. 10, a variable capacitance circuit CVA is coupled to the node N1 on the one end side of the resonator 10. A variable capacitance circuit CVB is coupled to the node N2 on the other end side of the resonator 10. These variable capacitance circuits CVA and CVB are implemented by variable capacitance elements such as varactors. The capacitance of the variable capacitance circuits CVA and CVB is variably controlled by the temperature compensation voltage VCP from the first temperature compensation circuit 40. An electrostatic protection circuit 37 is coupled to the node N1. An electrostatic protection circuit 38 is coupled to the node N2.

For example, the bipolar transistor BP of the drive circuit 36 of the oscillation circuit 30 in FIG. 10 has first-order frequency-temperature characteristics due to a variation injunction capacitance indicated by CP1 and CP2. For example, the bipolar transistor BP has frequency-temperature characteristics in which the frequency decreases as the temperature increases. The P-type transistor TB of the current source circuit 35 has first-order frequency-temperature characteristics due to a variation in gate-drain capacitance or drain-source capacitance indicated by CP3. The electrostatic protection circuits 37 and 38 have first-order frequency-temperature characteristics due to a variation in parasitic capacitance indicated by CP4 and CP5. The electrostatic protection circuits 37 and 38 are implemented by, for example, a diode, or a thyristor. As described above, the circuit elements constituting the drive circuit 36, the current source circuit 35, and the electrostatic protection circuits 37 and 38 of the oscillation circuit 30 have the first-order frequency-temperature characteristics. Among these frequency-temperature characteristics, the most dominant frequency-temperature characteristics are the frequency-temperature characteristics of the circuit elements of the drive circuit 36.

The first temperature compensation circuit 40 temperature-compensates for the frequency-temperature characteristics of the circuit elements of the oscillation circuit 30 by the first-order first temperature compensation processing. For example, by the first-order first temperature compensation processing of the first temperature compensation circuit 40, the temperature compensation for the frequency-temperature characteristics of the circuit elements of the drive circuit 36, which are dominant in the frequency-temperature characteristics of the circuit elements of the oscillation circuit 30, is performed. By the first-order first temperature compensation processing of the first temperature compensation circuit 40, the temperature compensation for the frequency-temperature characteristics of the circuit elements such as the current source circuit 35 and the electrostatic protection circuits 37 and 38 can also be performed. In this way, the first-order frequency-temperature characteristics of the first clock signal CK1 caused by the frequency-temperature characteristics of the circuit elements of the oscillation circuit 30 are temperature-compensated by the first-order first temperature compensation processing of the first temperature compensation circuit 40, and the frequency variation due to the temperature variation can be reduced. Accordingly, it is possible to reduce the frequency variation due to the temperature variation of the second clock signal CK2 output from the oscillator 4 based on the first clock signal CK1.

The second temperature compensation circuit 110 temperature-compensates for the frequency-temperature characteristics of the resonator 10 by the high-order second temperature compensation processing. In this way, when the resonator 10 has the high-order frequency-temperature characteristics such as third-order or fifth-order frequency-temperature characteristics, the high-order frequency-temperature characteristics are temperature-compensated by the high-order second temperature compensation processing of the second temperature compensation circuit 110, and the frequency variation due to the temperature variation can be reduced. Accordingly, it is possible to reduce the frequency variation due to the temperature variation of the second clock signal CK2 output from the oscillator 4.

2. First Temperature Compensation Circuit

Figure 11:
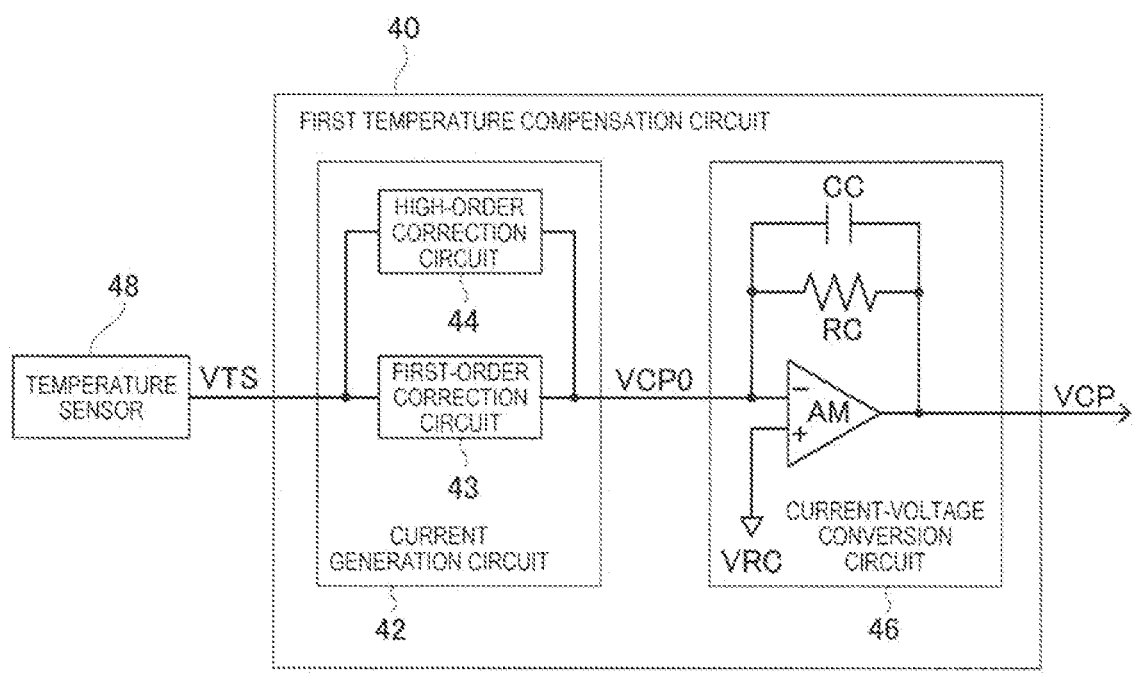
FIG. 11 is a configuration example of a first temperature compensation circuit.

FIG. 11 shows a configuration example of the first temperature compensation circuit 40. In the following description, a case where the first temperature compensation circuit 40 performs the first-order first temperature compensation processing and the high-order first temperature compensation processing in the second mode will be mainly described as an example. Although not shown in FIG. 11, circuits corresponding to the switches SA1 and SA2 in FIG. 2 are actually provided in the first temperature compensation circuit 40. The first temperature compensation circuit 40 is not limited to the configuration in FIG. 11, and various modifications such as omission of some of the constituent elements, addition of other constituent elements, and replacement of some of the constituent elements with other constituent elements are possible.

The first temperature compensation circuit 40 is a circuit that outputs the temperature compensation voltage VCP according to a polynomial approximation using a temperature as a variable. The first temperature compensation circuit 40 includes a current generation circuit 42 and a current-voltage conversion circuit 46. The current generation circuit 42 generates a function current based on the temperature detection result of the temperature sensor 48. For example, the current generation circuit 42 generates the function current for temperature-compensating for the frequency-temperature characteristics of the resonator 10 based on the temperature detection voltage VTS, which is the temperature detection result from the temperature sensor 48. Then, the current-voltage conversion circuit 46 converts the function current from the current generation circuit 42 into a voltage and outputs the temperature compensation voltage VCP. Specifically, the current-voltage conversion circuit 46 outputs the temperature compensation voltage VCP by an amplifier circuit AM.

The current generation circuit 42 includes the first-order correction circuit 43 and the high-order correction circuit 44. The first-order correction circuit 43 outputs, based on the temperature detection voltage VTS, a first-order current approximating a first-order function. For example, the first order correction circuit 43 outputs a first-order function current based on first-order correction data corresponding to a first-order coefficient of a polynomial in the polynomial approximation. The first-order correction circuit 43 includes, for example, an operational amplifier, a first variable resistance circuit, a second variable resistance circuit, and a third variable resistance circuit. The operational amplifier, the first variable resistance circuit, and the second variable resistance circuit constitute an amplifier circuit. The amplifier circuit amplifies the temperature detection voltage VTS with reference to a reference voltage VRC, for example. The amplifier circuit outputs the first-order current to an input node of the current-voltage conversion circuit 46 via the third variable resistance circuit.

The high-order correction circuit 44 outputs a high-order current approximating a high-order function to the current-voltage conversion circuit 46 based on the temperature detection voltage VTS. For example, the high-order correction circuit 44 outputs a high-order current based on high-order correction data corresponding to a high-order coefficient of the polynomial in the polynomial approximation. As an example, the high-order correction circuit 44 outputs a third-order current that approximates a third-order function. In this case, the high-order correction circuit 44 includes a first differential circuit that performs a differential operation based on the temperature detection voltage VTS, and a second differential circuit that performs a differential operation based on the output voltage of the first differential circuit and the temperature detection voltage VTS to output the third-order current. In FIG. 11, the temperature sensor 48 performs offset correction on the temperature detection voltage VTS based on zero-order correction data corresponding to a zero-order coefficient of the polynomial. That is, the temperature sensor 48 adjusts an offset of the temperature detection voltage VTS by an offset indicated by the zero-order correction data. The offset correction of the temperature detection voltage VTS corresponds to the zero-order correction in the temperature compensation of the oscillation frequency. The high-order correction circuit 44 may further include a correction circuit that performs fourth or higher-order correction. For example, the high-order correction circuit 44 may further include a fourth-order correction circuit that outputs a fourth-order current approximating a fourth-order function, a fifth-order correction circuit that outputs a fifth-order current approximating a fifth-order function, and the like.

The current-voltage conversion circuit 46 adds the first-order current and the high-order current, and performs current-voltage conversion on the current obtained by addition to output the temperature compensation voltage VCP. Accordingly, the temperature compensation voltage VCP that approximates a polynomial function is generated.

The current-voltage conversion circuit 46 includes the amplifier circuit AM, a resistor RC, and a capacitor CC. The amplifier circuit AM is implemented by an operational amplifier. The resistor RC and the capacitor CC are coupled in parallel between an output terminal and an inverting input terminal of the amplifier circuit AM. The reference voltage VRC is input to a non-inverting input terminal of the amplifier circuit AM. Accordingly, the current-voltage conversion circuit 46 outputs the temperature compensation voltage VCP by, for example, the amplifier circuit AM for a class A operation.

According to the first temperature compensation circuit 40 having such a configuration, the function current generated by the current generation circuit 42 based on the temperature detection result of the temperature sensor 48 can be converted into a voltage by the current-voltage conversion circuit 46 and the voltage can be output as the temperature compensation voltage VCP.

3. Second Temperature Compensation Circuit

Figure 12:
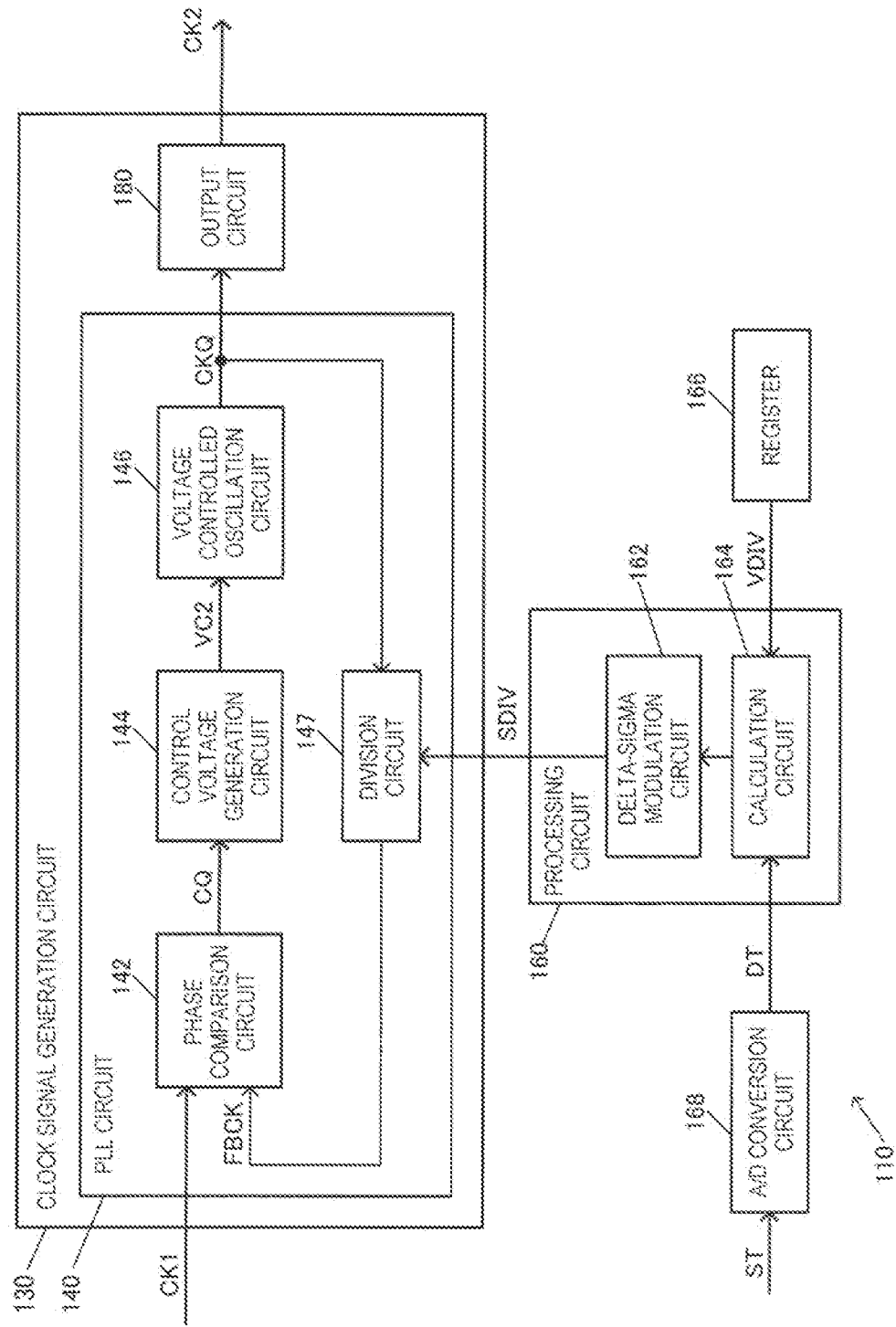
FIG. 12 is a configuration example of a second temperature compensation circuit.

FIG. 12 shows a configuration example of the second temperature compensation circuit 110. The second temperature compensation circuit 110 is not limited to the configuration in FIG. 12, and various modifications such as omission of some of the constituent elements, addition of other constituent elements, and replacement of some of the constituent elements with other constituent elements are possible.

In FIG. 12, the second temperature compensation circuit 110 includes a clock signal generation circuit 130 and a processing circuit 160. The second temperature compensation circuit 110 may include an A/D conversion circuit 168 and a register 166. The A/D conversion circuit 168 performs A/D conversion on a temperature detection voltage ST and outputs digital temperature detection data DT. The register 166 stores a division ratio setting value VDIV. The register 166 can be implemented by, for example, a flip-flop circuit. Alternatively, the register 166 may be implemented by a memory such as a RAM. The processing circuit 160 performs the second temperature compensation processing based on the temperature detection data DT, and outputs a division ratio setting signal SDIV as a digital frequency setting signal to the clock signal generation circuit 130. For example, the processing circuit 160 outputs, to the clock signal generation circuit 130, the division ratio setting signal SDIV for generating the second clock signal CK2 subjected to the second temperature compensation processing, based on the temperature detection data DT from the A/D conversion circuit 168 and the division ratio setting value VDIV from the register 166.

The clock signal generation circuit 130 includes a PLL circuit 140 to which the first clock signal CK1 is input as a reference clock signal. The PLL circuit 140 is, for example, a fractional-N type PLL circuit. A division circuit 147 performs a division processing at a division ratio set by the division ratio setting signal SDIV, which is a frequency setting signal.

In this way, the second temperature compensation circuit 110 includes the fractional-N type PLL circuit 140 that generates the second clock signal CK2 by multiplying the frequency of the first clock signal CK1. That is, the second temperature compensation circuit 110 includes the fractional-N type PLL circuit 140 to which the first clock signal CK1 is input as the reference clock signal, and the division ratio setting signal SDIV is input to the division circuit 147 of the PLL circuit 140 as the frequency setting signal. In this way, the division ratio setting signal SDIV subjected to the second temperature compensation processing is input to the division circuit 147 of the PLL circuit 140, a PLL operation of multiplying the frequency of the first clock signal CK1 is implemented, and the second clock signal CK2 based on the signal obtained by multiplying the frequency of the first clock signal CK1 can be generated. Accordingly, the second clock signal CK2 subjected to the second temperature compensation processing can be generated based on the first clock signal CK1. By using the fractional-N type PLL circuit 140, it is possible to set not only an integer but also a fraction as the division ratio of the PLL circuit 140, and it is possible to generate the second clock signal CK2 having any frequency.

Next, the configuration of the clock signal generation circuit 130 of the second temperature compensation circuit 110 in FIG. 12 will be described in more detail. In FIG. 12, the clock signal generation circuit 130 includes the PLL circuit 140 and an output circuit 180.

The output circuit 180 outputs the second clock signal CK2 based on a clock signal CKQ output from the PLL circuit 140. For example, the output circuit 180 includes a division circuit (not shown), and by performing division on the clock signal CKQ by the division circuit, the frequency of the second clock signal CK2 can be variably set. Accordingly, the frequency of the second clock signal CK2 can be set to a frequency desired by a user. The output circuit 180 outputs the second clock signal CK2 to the outside in a signal format such as low voltage differential signaling (LVDS), positive emitter coupled logic (PECL), high speed current steering logic (HCSL), or differential complementary MOS (CMOS). For example, the output circuit 180 may be a circuit capable of outputting the second clock signal CK2 in at least two signal formats of the LVDS, the PECL, the HCSL, and the differential CMOS. In this case, the output circuit 180 outputs the second clock signal CK2 in a signal format set by the processing circuit 160.

The PLL circuit 140 receives the first clock signal CK1 as the reference clock signal and performs a phase locked loop (PLL) operation. For example, the PLL circuit 140 generates the clock signal CKQ having a frequency obtained by multiplying the frequency of the first clock signal CK1. That is, the clock signal CKQ with high accuracy synchronized in phase with the first clock signal CK1 is generated. The PLL circuit 140 includes a phase comparison circuit 142, a control voltage generation circuit 144, a voltage controlled oscillation circuit 146, and the division circuit 147.

The phase comparison circuit 142 performs phase comparison between the first clock signal CK1, which is the reference clock signal, and a feedback clock signal FBCK. For example, the phase comparison circuit 142 compares phases of the first clock signal CK1 and the feedback clock signal FBCK, and outputs a signal CQ corresponding to a phase difference between the first clock signal CK1 and the feedback clock signal FBCK as a signal of a phase comparison result. The signal CQ corresponding to the phase difference is, for example, a pulse signal having a pulse width proportional to the phase difference.

The control voltage generation circuit 144 generates a control voltage VC2 based on the result of the phase comparison by the phase comparison circuit 142. For example, the control voltage generation circuit 144 performs a charge pump operation and a filter processing based on the signal CQ, which is the phase comparison result from the phase comparison circuit 142, to generate the control voltage VC2 for controlling the oscillation of the voltage controlled oscillation circuit 146.

The voltage controlled oscillation circuit 146, which is a voltage controlled oscillator (VCO), generates the clock signal CKQ having a frequency corresponding to the control voltage VC2. For example, an oscillation operation is performed based on the control voltage VC2 from the control voltage generation circuit 144 to generate the clock signal CKQ. For example, the voltage controlled oscillation circuit 146 generates the clock signal CKQ having a frequency that changes according to the control voltage VC2 by the oscillation operation. As an example, the voltage controlled oscillation circuit 146 has a variable capacitance element such as a varactor, and the capacitance of the variable capacitance element changes based on the control voltage VC2, whereby the frequency of the clock signal CKQ, which is an oscillation signal generated by the oscillation operation of the voltage controlled oscillation circuit 146, changes. As the voltage controlled oscillation circuit 146, for example, an LC oscillation circuit using an inductor can be used.

The division circuit 147 divides the clock signal CKQ and outputs the feedback clock signal FBCK. For example, the division circuit 147 outputs, as the feedback clock signal FBCK, a signal having a frequency obtained by dividing the frequency of the clock signal CKQ by the division ratio set by the division ratio setting signal SDIV. For example, when the frequency of the oscillation of the voltage controlled oscillation circuit 146 is fvco and a division ratio of a division operation of the division circuit 147 is DIV, the frequency of the feedback clock signal FBCK is fvco/DIV. As described above, the phase comparison circuit 142 performs the phase comparison between the first clock signal CK1 and the feedback clock signal FBCK from the division circuit 147.

By using the PLL circuit 140 having such a configuration including the phase comparison circuit 142, the control voltage generation circuit 144, the voltage controlled oscillation circuit 146, and the division circuit 147, the clock signal CKQ synchronized in phase with the first clock signal CK1 can be generated, and the second clock signal CK2 with high accuracy can be generated and output based on the clock signal CKQ.

In the present embodiment, the processing circuit 160 includes a delta-sigma modulation circuit 162 and a calculation circuit 164. By performing delta-sigma modulation by the delta-sigma modulation circuit 162, the PLL circuit 140 operates as a fractional-N type PLL circuit. The calculation circuit 164 performs the second temperature compensation processing based on the temperature detection data DT from the A/D conversion circuit 168 and the division ratio setting value VDIV from the register 166. The division ratio setting value VDIV is data for setting the division ratio of the PLL circuit 140. The delta-sigma modulation circuit 162 performs the delta-sigma modulation on a calculation value which is a calculation result of the calculation circuit 164, and outputs the division ratio setting signal SDIV for setting the division ratio of the division circuit 147.

For example, in FIG. 12, the division circuit 147 and the delta-sigma modulation circuit 162 constitute a fractional divider. The fractional divider divides the clock signal CKQ by using a reciprocal of a multiplication factor of the PLL circuit 140 as the division ratio, and outputs the divided clock signal as the feedback clock signal FBCK to the phase comparison circuit 142. The delta-sigma modulation circuit 162 performs the delta-sigma modulation on a value of a decimal part of the division ratio to generate a modulation value, which is an integer. For example, the delta-sigma modulation circuit 162 performs a third-order or fourth-order delta-sigma modulation processing. Then, a sum of the value of the integer part of the division ratio and the modulation value is set by the division circuit 147 as the division ratio setting signal SDIV. Accordingly, the fractional-N type PLL circuit 140 is implemented.

Specifically, the delta-sigma modulation circuit 162 performs the delta-sigma modulation in which a fractional division ratio L/M is integrated and quantized, and generates a delta-sigma modulation signal. Then, the delta-sigma modulation circuit 162 performs a processing of adding or subtracting the delta-sigma modulation signal to or from an integer division ratio N, and an output signal after the addition or subtraction is input to the division circuit 147. In the output signal after the addition or subtraction, a plurality of integer division ratios in a range near the integer division ratio N change in time series, and a time average value thereof coincides with N+L/M. The N+L/M is set by the division ratio setting signal SDIV from the processing circuit 160. For example, the frequency of the clock signal CKQ is fvco, and a phase comparison frequency that is the frequency of the first clock signal CK1 and the feedback clock signal FBCK is fpfd. In this case, in a steady state in which the phase of the first clock signal CK1, which is the reference clock signal, and the phase of the feedback clock signal FBCK are synchronized with each other, a relational expression fvco=(N+L/M)×fpfd is established. By using the fractional-N type PLL circuit 140 having such a configuration, it is possible to generate the clock signal CKQ obtained by multiplying the first clock signal CK1 by the division ratio represented by N+L/M.

The calculation circuit 164 performs the second temperature compensation processing based on the temperature detection data DT to generate a temperature compensation value. Then, the calculation circuit 164 performs a processing of adding the division ratio setting value VDIV and the temperature compensation value to obtain a calculation value, and outputs, as a calculation result, the obtained calculation value to the delta-sigma modulation circuit 162. The delta-sigma modulation circuit 162 performs the delta-sigma modulation on the calculation value to generate the division ratio setting signal SDIV, and outputs the division ratio setting signal SDIV to the division circuit 147.

In this way, the fractional divider can be implemented, and the second temperature compensation processing for preventing the variation in the frequency of the second clock signal CK2 due to the temperature change can be implemented. A fractional division processing for implementing the fractional divider and the temperature compensation processing can be collectively executed by a digital calculation processing in the processing circuit 160. Therefore, it is possible to implement the fractional division processing and the temperature compensation processing while preventing an increase in a circuit scale of the second temperature compensation circuit 110.

Various processings are conceivable as the second temperature compensation processing performed by the second temperature compensation circuit 110. For example, the processing circuit 160 provided in the second temperature compensation circuit 110 may perform the second temperature compensation processing based on information on a trained model. For example, the processing circuit 160 performs the second temperature compensation processing based on the temperature detection result of the temperature sensor and the information on the trained model stored in a storage circuit (not shown). Then, the frequency setting signal subjected to the temperature compensation processing is generated. The storage circuit can be implemented by a semiconductor memory such as a nonvolatile memory. For example, the storage circuit stores information on the trained model subjected to machine learning so as to obtain a temperature compensation value corresponding to a temperature measurement result. The processing circuit 160 performs the second temperature compensation processing for obtaining a temperature compensation value corresponding to each temperature based on the temperature detection result and the information on the trained model in the storage circuit. When the processing circuit 160 performs a neural network operation, the storage circuit stores information on a weighting coefficient of the neural network operation as the information on the trained model. The processing circuit 160 performs the second temperature compensation processing for obtaining the temperature compensation value corresponding to each temperature, for example, by reading the information on the weighting coefficient from the storage circuit based on the temperature detection data corresponding to the temperature detection result and performing the neural network operation.

In this way, by performing the second temperature compensation processing using the information on the trained model, it is possible to implement a more accurate and appropriate second temperature compensation processing. For example, during manufacturing or shipment of the oscillator 4, information on the trained model obtained by measuring the frequency-temperature characteristics of the oscillator 4 is written and stored in the storage circuit implemented by a nonvolatile memory or the like. For example, during manufacturing or shipment of the oscillator 4, the frequency characteristics of the clock signal at each temperature are measured while changing the environmental temperature using a thermostatic oven or the like. Then, the information on the trained model obtained based on a measurement result is written and stored in the storage circuit. For example, a clock frequency and a temperature detection signal at each temperature are monitored, and the information on the trained model subjected to machine learning so as to obtain an appropriate temperature compensation value corresponding to a value of the temperature detection signal at each temperature is written and stored in the storage circuit. In this way, during an actual operation of the oscillator 4, the processing circuit 160 can execute the second temperature compensation processing for obtaining temperature compensation data corresponding to the temperature detection result of the temperature sensor. Accordingly, it is possible to implement the second temperature compensation processing in which the influence of a process variation in manufacturing, a variation in the circuit characteristics, and the like is prevented and cancelled.

4. Variable Capacitance Circuit

Figure 13:
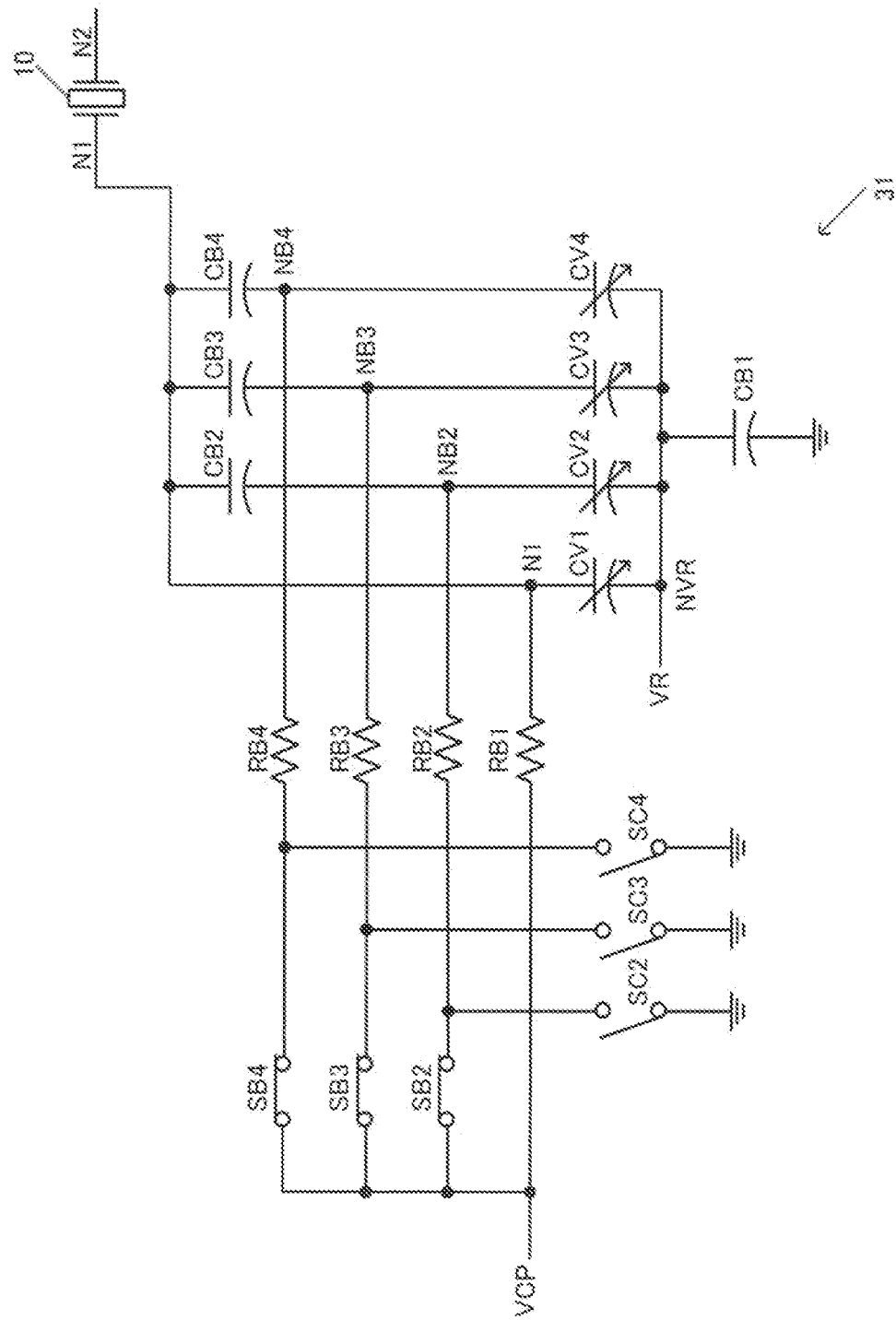
FIG. 13 is a configuration example of a variable capacitance circuit having a variable capacitance sensitivity.

FIG. 13 shows a configuration example of the variable capacitance circuit 31. The variable capacitance circuit 31 in FIG. 13 can variably set the capacitance sensitivity.

In FIG. 13, the variable capacitance circuit 31 includes a plurality of variable capacitance elements CV1, CV2, CV3, and CV4. The variable capacitance elements CV1 to CV4 are, for example, MOS varactors. The variable capacitance circuit 31 includes capacitors CB2, CB3, and CB4 for DC cut, with one ends coupled to the node N1 on one end side of the resonator 10. Nodes NB2, NB3, and NB4 at the other ends of the capacitors CB2, CB3, and CB4 are coupled to one ends of the variable capacitance elements CV2, CV3, and CV4, respectively. One end of the variable capacitance element CV1, which is a reference variable capacitance element, is coupled to the node N1 on the one end side of the resonator 10. Nodes NVR at the other ends of the variable capacitance elements CV1, CV2, CV3, and CV4 are coupled to one end of the capacitor CB1. The other end of the capacitor CB1 is coupled to a GND node. A reference voltage VR is supplied to the nodes NVR at the other ends of the variable capacitance elements CV1, CV2, CV3, and CV4. Each of the variable capacitance elements CV1, CV2, CV3, and CV4 preferably has a configuration in which a plurality of variable capacitance elements to which different reference voltages VR are to be supplied are coupled in parallel to each other at the other end.

The variable capacitance circuit 31 includes switches SB2, SB3, and SB4 and switches SC2, SC3, and SC4 for varying the capacitance sensitivity. The variable capacitance circuit 31 includes resistors RB1, RB2, RB3, and RB4. The temperature compensation voltage VCP is supplied to one end of each of the switches SB2, SB3, and SB4. One ends of the switches SC2, SC3, and SC4 and one ends of the resistors RB2, RB3, and RB4 are coupled to the other ends of the switches SB2, SB3, and SB4. The other ends of the switches SC2, SC3, and SC4 are coupled to the GND node.

The other ends of the resistors RB2, RB3, and RB4 are coupled to the nodes NB2, NB3, and NB4. The temperature compensation voltage VCP is supplied to one end of the resistor RB1. The other end of the resistor RB1 is coupled to the node Nl.

The switch SB2 and the switch SC2 are exclusively turned on or off. The switch SB3 and the switch SC3 are also exclusively turned on or off. The switch SB4 and the switch SC4 are also exclusively turned on or off. When the capacitance sensitivity of the variable capacitance circuit 31 is set to the minimum, the switches SB2, SB3, and SB4 are turned off, and the switches SC2, SC3, and SC4 are turned on. Accordingly, one ends of the variable capacitance elements CV2, CV3, and CV4 are set to a GND potential, and the variable capacitance elements CV2, CV3, and CV4 do not function as the capacitance of the variable capacitance circuit 31. Then, the variable capacitance element of the variable capacitance circuit 31 is only the variable capacitance element CV1 which is the reference variable capacitance element, and only the capacitance of the variable capacitance element CV1 is controlled based on the temperature compensation voltage VCP. Accordingly, the capacitance sensitivity, which is the sensitivity of the capacitance change with respect to the temperature compensation voltage VCP in the variable capacitance circuit 31, is minimized. Therefore, as described with reference to FIGS. 3 and 4, when the oscillator 4 is used as the TCXO or the OCXO and is set to the first mode, and the first temperature compensation circuit 40 performs the first-order first temperature compensation processing, the switches SB2, SB3, and SB4 are turned off, and the switches SC2, SC3, and SC4 are turned on, so that the sensitivity is set to a low capacitance sensitivity. By lowering the capacitance sensitivity in this manner, it is possible to reduce the near noise as described with reference to FIGS. 3 and 4.

On the other hand, when the capacitance sensitivity of the variable capacitance circuit 31 is set to the maximum, the switches SB2, SB3, and SB4 are turned on, and the switches SC2, SC3, and SC4 are turned off. Accordingly, all the variable capacitance elements CV1, CV2, CV3, and CV4 function as the capacitances of the variable capacitance circuit 31, and the temperature compensation voltage VCP is supplied to one ends of the variable capacitance elements CV1, CV2, CV3, and CV4. Therefore, the capacitances of the variable capacitance elements CV1, CV2, CV3, and CV4 are controlled based on the temperature compensation voltage VCP. Accordingly, the capacitance sensitivity of the variable capacitance circuit 31 is maximized. Therefore, as described with reference to FIGS. 3 and 4, when the oscillator 4 is used as the TCXO and is set to the second mode, and the first temperature compensation circuit 40 performs the first-order first temperature compensation processing and the high-order first temperature compensation processing, the switches SB2, SB3, and SB4 are turned on, and the switches SC2, SC3, and SC4 are turned off, so that the capacitance sensitivity is set to a high sensitivity. By increasing the capacitance sensitivity in this manner, as described with reference to FIGS. 3 and 4, it is possible to reduce the frequency variation in the frequency-temperature characteristics as compared with the case where the oscillator is used as the TCXO and is set to the first mode.

In FIG. 13, the capacitance sensitivity of the variable capacitance circuit 31 can be adjusted to a sensitivity in multiple stages between the maximum and the minimum. Alternatively, the capacitance sensitivity may be implemented to simply switch between the maximum and the minimum of the capacitive sensitivity. In FIG. 13, the case where the variable capacitance circuit 31 is provided at the node N1 on the one end side of the resonator 10 is described. Alternatively, it is desirable to provide the variable capacitance circuit 31 also at the node N2 on the other end side of the resonator 10.

5. First Circuit Device and Second Circuit Device

Figure 14:
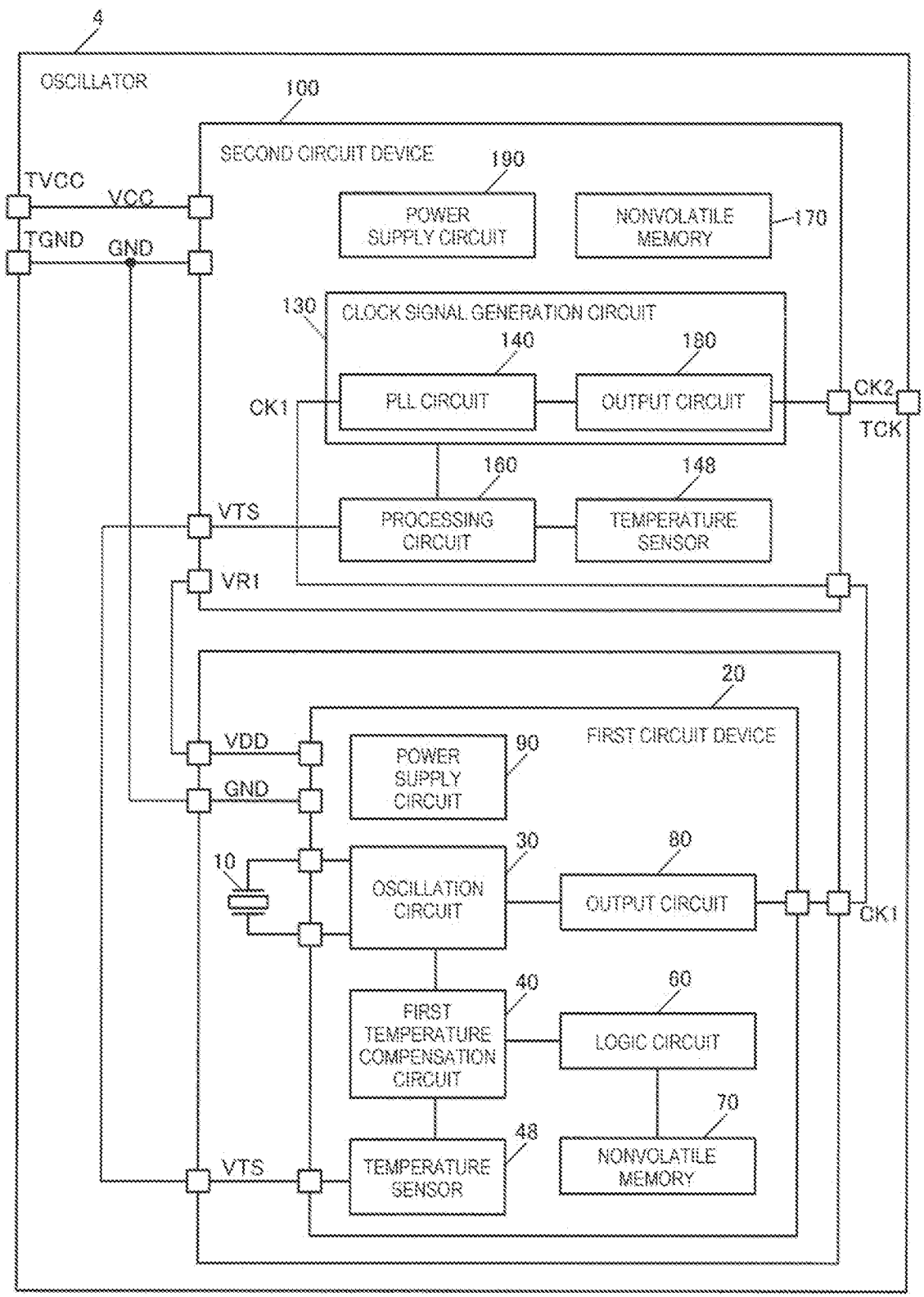
FIG. 14 is a configuration example of an oscillator including a first circuit device and a second circuit device.

FIG. 14 shows a configuration example of the oscillator 4 including a first circuit device 20 and a second circuit device 100. In the present embodiment, as shown in FIG. 14, the oscillator 4 can include the first circuit device 20 including the oscillation circuit 30 and the first temperature compensation circuit 40, and the second circuit device 100 including the second temperature compensation circuit 110. For example, the first circuit device 20 is a first IC chip, and the second circuit device 100 is a second IC chip. In FIG. 14, as described with reference to FIG. 12, the second temperature compensation circuit 110 includes the clock signal generation circuit 130 and the processing circuit 160. As will be described later with reference to FIGS. 17 to 19, for example, the resonator 10 and the first circuit device 20 are accommodated in a first package 15, and the second circuit device 100 and the first package 15 are accommodated in a second package 5.

With the configuration shown in FIG. 14, the first clock signal CK1 subjected to the first temperature compensation processing can be generated by the oscillation circuit 30 and the first temperature compensation circuit 40 included in the first circuit device 20, and the first clock signal CK1 subjected to the first temperature compensation processing can be input to the second circuit device 100. Then, the second temperature compensation circuit 110 included in the second circuit device 100 can generate the second clock signal CK2 subjected to the second temperature compensation processing based on the received first clock signal CK1 and output the second clock signal CK2 from a terminal TCK of the oscillator 4.

In FIG. 14, the first circuit device 20 includes a logic circuit 60, a nonvolatile memory 70, the temperature sensor 48, an output circuit 80, and a power supply circuit 90 in addition to the oscillation circuit 30 and the first temperature compensation circuit 40.

The logic circuit 60 is a control circuit and performs various control processings. For example, the logic circuit 60 controls the entire first circuit device 20 or controls an operation sequence of the first circuit device 20. The logic circuit 60 performs various processings for controlling the oscillation circuit 30 and controls reading and writing of information from and to the nonvolatile memory 70. The logic circuit 60 may be implemented by, for example, an application specific integrated circuit (ASIC) using automatic place and route such as a gate array.

The nonvolatile memory 70 is a memory that stores information even without power supply. For example, the nonvolatile memory 70 is a memory that can store information without power supply and can rewrite information. The nonvolatile memory 70 stores various kinds of information necessary for an operation and the like of the first circuit device 20. The nonvolatile memory 70 may be implemented by an electrically erasable programmable read-only memory (EEPROM) or the like implemented by a floating gate avalanche injection MOS memory (FAMOS memory) or a metal-oxide-nitride-oxide-silicon memory (MONOS memory). For example, the nonvolatile memory 70 stores coefficient information on the polynomial described above when the first temperature compensation circuit 40 performs the analog first temperature compensation processing. Specifically, the nonvolatile memory 70 stores the information on the zero-order coefficient, the first-order coefficient, and the high-order coefficient of the polynomial as the zero-order correction data, the first-order correction data, and the high-order correction data, respectively.

The temperature sensor 48 is a sensor that is provided in the first circuit device 20 and detects a temperature, and outputs the temperature detection result such as the temperature detection voltage. The output circuit 80 outputs the first clock signal CK1 based on the oscillation signal of the oscillation circuit 30. For example, the output circuit 80 buffers the oscillation signal, which is an oscillation clock signal from the oscillation circuit 30, and outputs the oscillation signal as the first clock signal CK1 to a pad of the first circuit device 20. The first clock signal CK1 is input to the second circuit device 100 as shown in FIG. 14.

The power supply circuit 90 is supplied with a power supply voltage VDD and a ground voltage GND, and supplies various power supply voltages for an internal circuit of the first circuit device 20 to the internal circuit. In FIG. 14, for example, a power supply voltage VCC supplied to a terminal TVCC of the oscillator 4 is supplied to a power supply circuit 190 of the second circuit device 100, and a power supply voltage VR1 generated by the power supply circuit 190 by, for example, a regulator is supplied as the power supply voltage VDD to the power supply circuit 90 of the first circuit device 20. The ground voltage GND supplied to a terminal TGND of the oscillator 4 is supplied to the power supply circuit 90 of the first circuit device 20.

In FIG. 14, the second circuit device 100 includes a temperature sensor 148, a nonvolatile memory 170, and the power supply circuit 190 in addition to the second temperature compensation circuit 110 including the clock signal generation circuit 130 and the processing circuit 160.

The temperature sensor 148 is a sensor that is provided in the second circuit device 100 and detects a temperature. In FIG. 14, the temperature detection voltage VTS, which is a temperature detection result of the temperature sensor 148 provided in the first circuit device 20, and the temperature detection result from the temperature sensor 148 provided in the second circuit device 100 are input to the processing circuit 160. Then, the processing circuit 160 performs the second temperature compensation processing based on the temperature detection result of the temperature sensor 48, which is a first temperature sensor, and the temperature detection result of the temperature sensor 148, which is a second temperature sensor. In this way, it is possible to perform the second temperature compensation processing based on not only the temperature detection result of the temperature sensor 148 of the second circuit device 100 but also the temperature detection result of the temperature sensor 48 disposed near the resonator 10, and it is possible to perform the temperature compensation processing capable of appropriately compensating for the frequency-temperature characteristics of the resonator 10.

The nonvolatile memory 170 is a memory that retains information even without power supply, and is, for example, a memory that can retain information even without power supply and can rewrite information. The nonvolatile memory 170 stores various kinds of information necessary for the operation and the like of the second circuit device 100. The nonvolatile memory 170 can be implemented by an EEPROM or the like implemented by a FAMOS memory or a MONOS memory. For example, the nonvolatile memory 170 stores information necessary for the digital second temperature compensation processing when the second temperature compensation circuit 110 performs the digital second temperature compensation processing. For example, as described above, when the processing circuit 160 performs the second temperature compensation processing based on the information on the trained model, the nonvolatile memory 170 stores the information on the trained model.

FIG. 15 shows another configuration example of the oscillator 4 including the first circuit device 20 and the second circuit device 100. FIG. 15 is different from FIG. 14 in that the heater circuit 22 is provided in the oscillator 4 in FIG. 15. For example, the heater circuit 22 is disposed in the vicinity of the resonator 10. By providing the heater circuit 22 in the oscillator 4 as described above, the temperature of the resonator 10 can be kept constant as shown in FIG. 5. Accordingly, the oscillator 4 which is an OCXO including the thermostatic oven described with reference to FIG. 6 can be implemented. That is, as shown in FIG. 6, the temperature of the resonator 10 is set to a constant temperature such as 105° C. by the heater circuit 22. Accordingly, it is possible to implement the oscillator 4 which is an OCXO in which the frequency variation in the operating temperature range is small as described with A2 and A3 by using the SC cut resonator 10 having the frequency-temperature characteristics indicated by A1 in FIG. 6.

The heater circuit 22 includes a heat generating element. The heat generating element can be implemented by, for example, a heat generating transistor in which a plurality of transistors are coupled in parallel. Then, for example, based on a heater control signal HCT, a current flows through the heat generating element implemented by the heat generating transistor, so that the heat generating element generates heat. The heat generation of the heat generating element enables the heater control to keep the temperature of the resonator 10 constant.

In FIG. 15, the second circuit device 100 includes a heater control circuit 192 that performs the heater control on the heater circuit 22. Then, the heater control signal HCT output from the heater control circuit 192 is input to the heater circuit 22 via a pad or the like of the second circuit device 100. Accordingly, the heater control signal HCT from the heater control circuit 192 controls the heat generation of the heat generating element of the heater circuit 22, thereby enabling the heater control to keep the temperature of the resonator 10 constant. Specifically, the heater control circuit 192 can perform the heater control based on the temperature detection result from a temperature sensor for oven control. By providing the heater control circuit 192 in the second circuit device 100 in this manner, the oven control in the OCXO is enabled by the heater control on the heater circuit 22 by the heater control circuit 192. That is, the oven control on the oven type oscillator 4 including the thermostatic oven can be implemented. For example, the temperature of the resonator 10 can be kept constant by controlling the temperature of the thermostatic oven, which is an oven in which the resonator 10 is provided. The thermostatic oven may be a single oven type or a double oven type.

6. Jitter Cleaning Circuit

Figure 16:
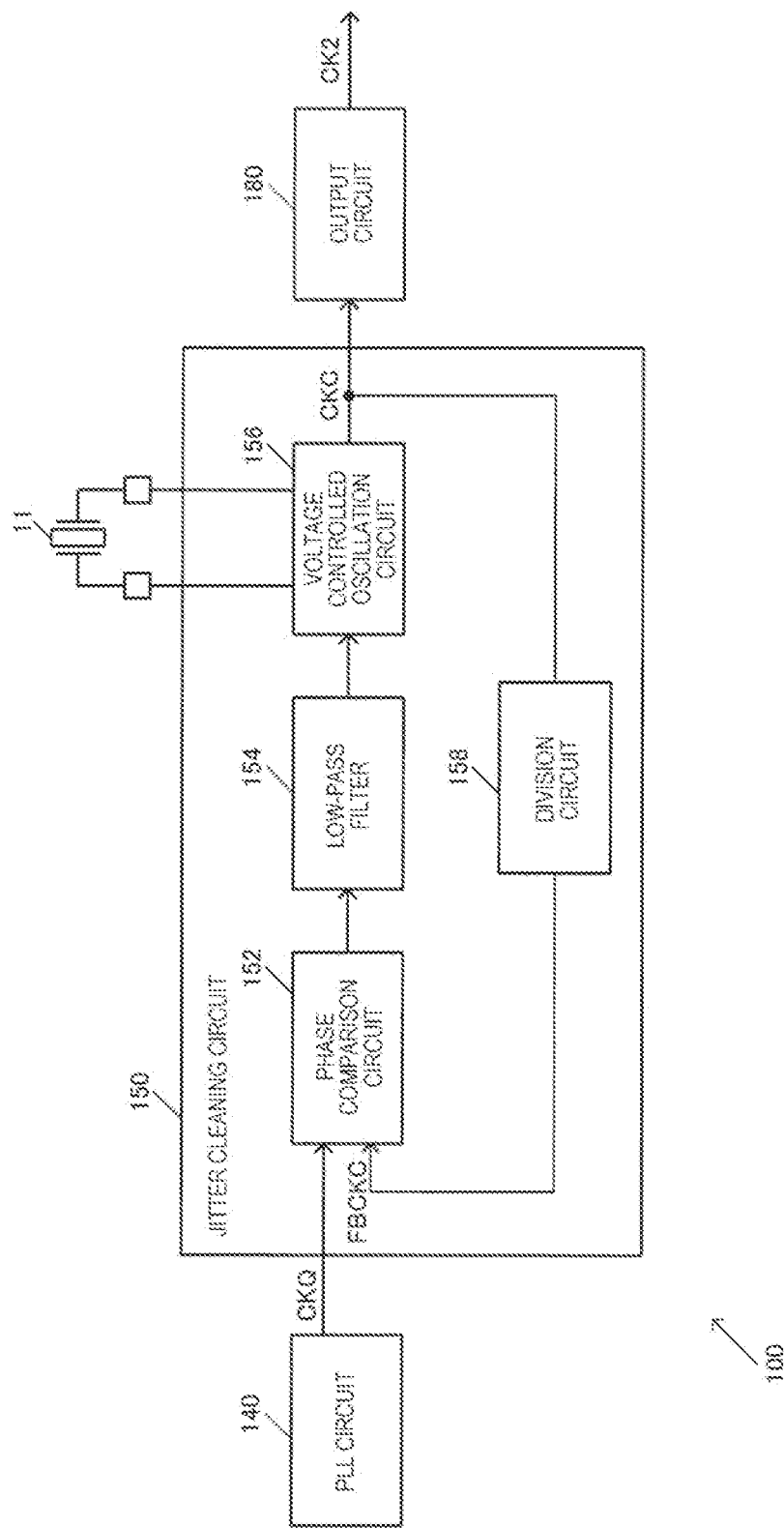
FIG. 16 is a configuration example of a jitter cleaning circuit.

In the present embodiment, for example, as shown in FIG. 16, the jitter cleaning circuit 150 that performs the jitter cleaning on the second clock signal CK2 may be provided in the second circuit device 100. By providing such a jitter cleaning circuit 150, as described with reference to FIGS. 4 and 7, the floor noise can be reduced, and the characteristics of the phase noise can be improved.

As shown in FIG. 16, the jitter cleaning circuit 150 is a PLL circuit for jitter cleaning, including a phase comparison circuit 152, a low-pass filter 154, a voltage controlled oscillation circuit 156, and a division circuit 158.

The phase comparison circuit 152 performs phase comparison between the clock signal CKQ from the PLL circuit 140 and the feedback clock signal FBCKC, and outputs a signal corresponding to a phase difference between the clock signal CKQ and the feedback clock signal FBCKC as a phase comparison result signal. The low-pass filter 154 performs a low-pass filter processing on the phase comparison result signal from the phase comparison circuit 152, removes a high-frequency component, and outputs a control voltage of an oscillation frequency to the voltage controlled oscillation circuit 156. The voltage controlled oscillation circuit 156 performs an operation of oscillating a resonator 11 and outputs the clock signal CKC having a frequency corresponding to the control voltage. The division circuit 158 divides the clock signal CKC and outputs the feedback clock signal FBCKC to the phase comparison circuit 152. The output circuit 180 buffers the clock signal CKC generated by the voltage controlled oscillation circuit 156, and outputs the second clock signal CK2.

In this way, in FIG. 16, the PLL circuit for jitter cleaning including the phase comparison circuit 152, the low-pass filter 154, the voltage controlled oscillation circuit 156, and the division circuit 158 is provided at a subsequent stage of the PLL circuit 140. Since the PLL circuit for jitter cleaning generates the clock signal CKC by, for example, the voltage controlled oscillation circuit 156 that oscillates the resonator 11, the phase noise is lower than that of the PLL circuit 140 or the like. Therefore, when the jitter cleaning circuit 150 implemented by the PLL circuit for jitter cleaning is provided at the subsequent stage of the PLL circuit 140 and the second clock signal CK2 is output, phase noise having a high frequency generated in the PLL circuit 140 can also be reduced. Therefore, as described with reference to FIG. 9, floor noise having a high frequency can be reduced, and the characteristics of the phase noise of the second clock signal CK2 can be improved.

7. Oscillator

Figure 17:
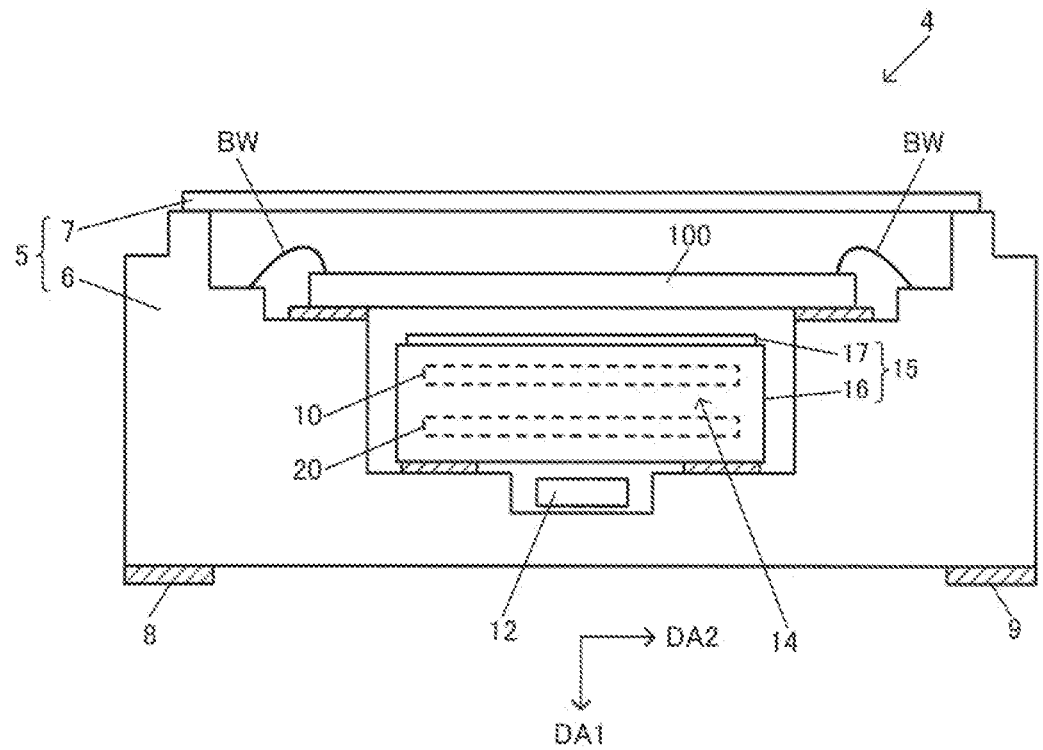
FIG. 17 is a structural example of the oscillator.

Next, a structural example of the oscillator 4 will be described. FIG. 17 shows a first structural example of the oscillator 4. FIG. 17 is a cross-sectional view schematically showing the structure of the oscillator 4. In the present embodiment, the oscillator 4 includes the resonator 10, the first circuit device 20, and the second circuit device 100. Specifically, the oscillator 4 includes the first package 15 in which the resonator 10 and the first circuit device 20 are accommodated, and the second package 5 in which the first package 15 and the second circuit device 100 are accommodated. The first package 15 and the second package 5 may be referred to as a first container and a second container, respectively.

In the present embodiment, the first circuit device 20 accommodated in the first package 15 performs the first temperature compensation processing, and the second circuit device 100 accommodated in the second package 5 performs the second temperature compensation processing. For example, when the resonator 10 and the first circuit device 20 are accommodated in the first package 15, a temperature compensated oscillator 14 that performs, for example, the analog first temperature compensation processing is implemented. When the oscillator 14 that performs the analog first temperature compensation processing and the second circuit device 100 that performs the digital second temperature compensation processing are accommodated in the second package 5, the oscillator 4 that generates the clock signal with high accuracy is implemented. The second circuit device 100 can also be referred to as a correction IC that performs the second temperature compensation processing for fine adjustment by a digital method.

Specifically, the second package 5 is formed of, for example, ceramic, and has an accommodation space therein. The oscillator 14 in which the resonator 10 and the first circuit device 20 are accommodated in the first package 15 and the second circuit device 100 are accommodated in the accommodation space. The accommodation space is hermetically sealed, and is preferably in a depressurized state, which is a state close to vacuum. The second package 5 can suitably protect the second circuit device 100 and the oscillator 14 from impact, dust, heat, moisture, and the like.

The second package 5 includes a base 6 and a lid 7. Specifically, the second package 5 includes the base 6 that supports the oscillator 14 and the second circuit device 100, and the lid 7 that is bonded to an upper surface of the base 6 so as to form an accommodation space between the lid 7 and the base 6. The base 6 has therein a first recessed portion open on the upper surface and a second recessed portion open on a bottom surface of the first recessed portion. The second circuit device 100 is supported by the bottom surface of the first recessed portion. For example, the second circuit device 100 is supported by a step portion of the bottom surface via terminal electrodes. The oscillator 14 is supported by a bottom surface of the second recessed portion. For example, the oscillator 14 is supported by a step portion of the bottom surface via terminal electrodes. The base 6 has a third recessed portion open on the bottom surface of the second recessed portion, and a circuit component 12 is disposed in the third recessed portion. As the circuit component 12 to be disposed, for example, a capacitor or an external temperature sensor can be assumed.

The second circuit device 100 is electrically coupled to terminals of the oscillator 14 via, for example, bonding wires BW, terminal electrodes formed on the step portion, or an internal wiring of the second package 5. Accordingly, the temperature detection voltage VTS or the first clock signal CK1 from the oscillator 14 can be input to the second circuit device 100. The second circuit device 100 is electrically coupled to external terminals 8 and 9 of the oscillator 4 via the bonding wires BW, the terminal electrodes formed on the step portion, and the internal wiring of the second package 5. The external terminals 8 and 9 are formed on an outer bottom surface of the second package 5. The external terminals 8 and 9 are coupled to an external device via an external wiring. The external wiring is, for example, a wiring formed on a circuit board on which an external device is mounted. Accordingly, the second circuit device 100 and the external device can be electrically coupled to each other, and the second clock signal CK2 and the like can be output to the external device. The terminals of the oscillator 14 may be electrically coupled to the external terminals 8 and 9.

In FIG. 17, the oscillator 14 is disposed below the second circuit device 100. For example, a direction orthogonal to a substrate of the second circuit device 100 and toward a bottom surface of the second package 5 is referred to as a direction DA1, and a direction orthogonal to the direction DA1 is referred to as a direction DA2. The substrate of the second circuit device 100 is a semiconductor substrate. In this case, the oscillator 14 is disposed in the direction DA1 of the second circuit device 100. The circuit component 12 is disposed in the direction DA1 of the oscillator 14. The second circuit device 100 is disposed with the direction DA2 as a longitudinal direction of the substrate.

Figure 18:
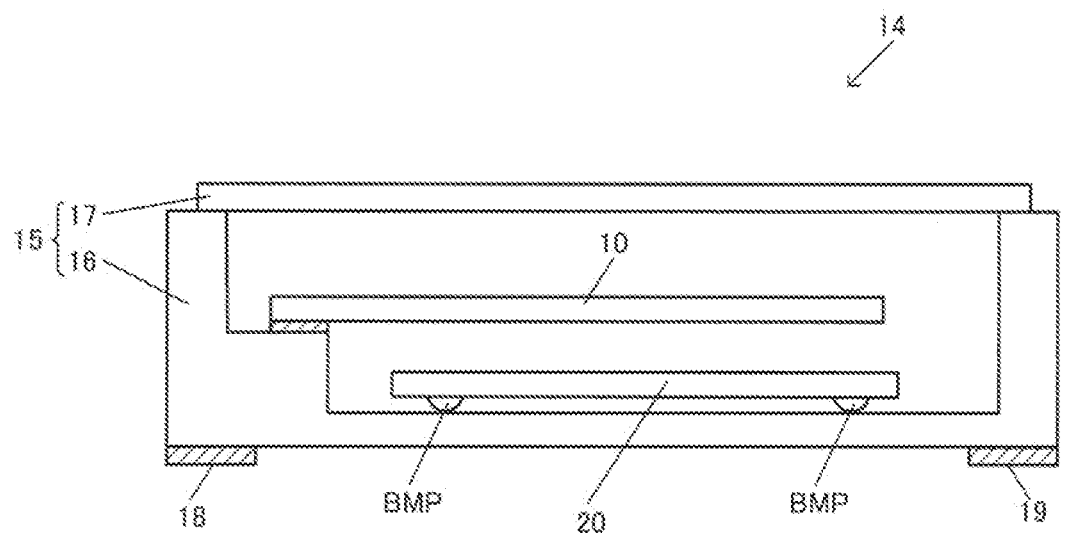
FIG. 18 is a structural example of the oscillator.

FIG. 18 shows a structural example of the oscillator 14. The oscillator 14 includes the resonator 10, the first circuit device 20, and the first package 15 in which the resonator 10 and the first circuit device 20 are accommodated. The first package 15 is formed of, for example, ceramic, and has an accommodation space therein. The resonator 10 and the first circuit device 20 are accommodated in the accommodation space. The accommodation space is hermetically sealed, and is preferably in a depressurized state, which is a state close to vacuum. The first package 15 can suitably protect the resonator 10 and the first circuit device 20 from impact, dust, heat, moisture, and the like.

The first package 15 includes a base 16 and a lid 17. Specifically, the first package 15 includes the base 16 that supports the resonator 10 and the first circuit device 20, and the lid 17 that is bonded to an upper surface of the base 16 so as to form an accommodation space between the lid 17 and the base 16. The resonator 10 is supported by a step portion provided inside the base 16 via terminal electrodes. The first circuit device 20 is disposed on an inner bottom surface of the base 16. Specifically, the first circuit device 20 is disposed such that an active surface faces the inner bottom surface of the base 16. The active surface is a surface on which circuit elements of the first circuit device 20 are formed. Bumps BMP are formed on terminals which are pads of the first circuit device 20. The first circuit device 20 is supported on the inner bottom surface of the base 16 via the conductive bumps BMP. The conductive bump BMP is, for example, a metal bump. The resonator 10 and the first circuit device 20 are electrically coupled to each other via the bumps BMP, an internal wiring of the first package 15, the terminal electrodes, and the like. The first circuit device 20 is electrically coupled to external terminals 18 and 19 of the oscillator 14 via the bumps BMP and the internal wiring of the first package 15. The external terminals 18 and 19 are formed on an outer bottom surface of the first package 15. Further, as shown in FIG. 17, the external terminals 18 and 19 of the oscillator 14 are electrically coupled to the second circuit device 100 via the bonding wire BW, the internal wiring, and the terminal electrodes. Accordingly, the first clock signal CK1 and the temperature detection voltage VTS from the oscillator 14 can be input to the second circuit device 100.

In FIG. 18, the first circuit device 20 is flip mounted such that the active surface of the first circuit device 20 faces downward. The present embodiment is not limited to such mounting. For example, the first circuit device 20 may be mounted such that the active surface of the first circuit device 20 faces upward. That is, the first circuit device 20 is mounted such that the active surface faces the resonator 10. According to this mounting, the temperature sensor formed on the active surface of the first circuit device 20 faces the resonator 10. A double-seal structure in which the resonator 10 and the first circuit device 20 are accommodated in the first package 15 of the oscillator 14 and the oscillator 14 and the second circuit device 100 are accommodated in the second package 5 is described above. However, the structure of the oscillator 4 according to the present embodiment is not limited thereto, and various modifications can be made. For example, a single-seal structure in which the resonator 10, the first circuit device 20, and the second circuit device 100 are accommodated in one second package 5 may be adopted.

Figure 19:
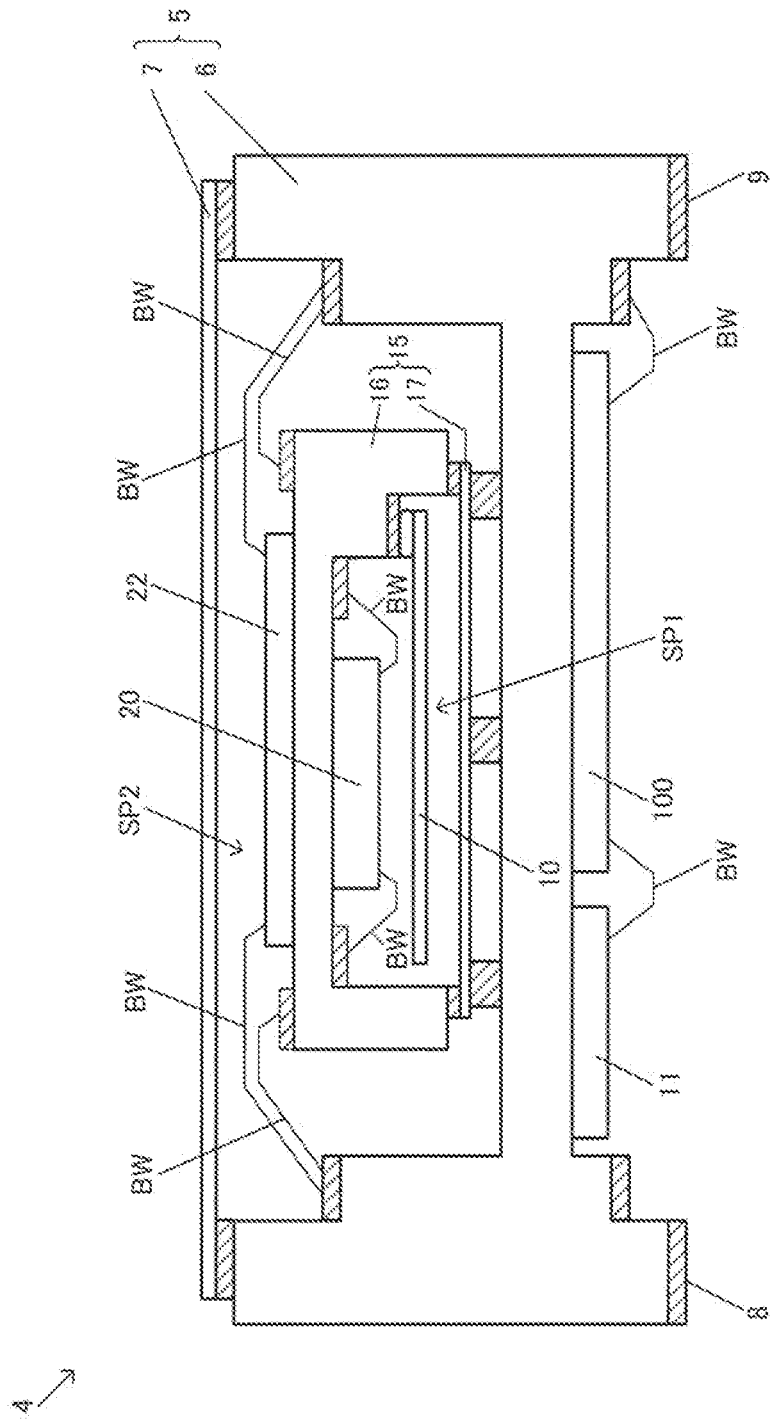
FIG. 19 is a structural example when the oscillator is the OCXO.

FIG. 19 shows a structural example when the oscillator 4 is used as the OCXO. The oscillator 4 in FIG. 19 includes the first package 15 in which the resonator 10 and the first circuit device 20 are accommodated, the heater circuit 22, and the second package 5 in which the heater circuit 22 and the first package 15 are accommodated.

In this way, it is possible to implement an OCXO in which the first package 15 accommodating the resonator 10 and the first circuit device 20 is used as the thermostatic oven. For example, the heater circuit 22, which is a heater IC, is disposed on the upper surface of the first package 15. The temperature of the first package 15, which is the thermostatic oven, is controlled by heat generation control on the heat generating element of the heater circuit 22 based on the heater control signal HCT described with reference to FIG. 15. Accordingly, for example, even when the environmental temperature changes, temperature control is performed so as to keep the temperature of the resonator 10 constant, and it is possible to implement the OCXO which is an oven controlled crystal oscillator.

Further, according to the structure of the oscillator 4 in FIG. 19, it is possible to use an existing oscillator product including the resonator 10, the first circuit device 20, and the first package 15 accommodating the resonator 10 and the first circuit device 20. That is, the existing oscillator product including the resonator 10, the first circuit device 20, and the first package 15 is accommodated in the second package 5 together with the heater circuit 22 which is a heater IC, so that the OCXO can be implemented. Therefore, it is possible to implement the OCXO that effectively uses the existing oscillator product, and it is possible to reduce a product cost, a development cost, a development period, and the like.

The oscillator 4 in FIG. 19 includes the second circuit device 100 that is provided in the second package 5 and outputs the heater control signal HCT to the heater circuit 22, and the resonator 11 for jitter cleaning which is coupled to the second circuit device 100. As shown in FIG. 15, the second circuit device 100 includes the heater control circuit 192 which is an oven control circuit, and the heater control signal HCT from the heater control circuit 192 is input to the heater circuit 22 to control heat generation of the heat generating element of the heater circuit 22. In this way, when the second circuit device 100 performs the temperature control based on the heater control signal HCT, the heat generation control of the heat generating element of the heater circuit 22 is performed. Therefore, the temperature control of the first package 15 serving as the thermostatic oven is performed, and the OCXO is implemented. The second circuit device 100 incorporates the jitter cleaning circuit 150 shown in FIG. 16. The characteristics of the phase noise of the output signal are improved by the PLL circuit for jitter cleaning coupled to the resonator 11.

In FIG. 19, the resonator 10 and the first circuit device 20 are accommodated in an accommodation space SP1 inside the first package 15. The first package 15 and the heater circuit 22 are accommodated in an accommodation space SP2 inside the second package 5. A recessed portion is formed in the bottom surface of the second package 5. The second circuit device 100 and the resonator 11 are mounted on a bottom surface of the recessed portion.

The oscillator 4 is not limited to the structure in FIG. 19, and various modifications can be made. For example, the second circuit device 100 may be disposed in the accommodation space SP2 of the second package 5. The heater circuit 22 may be provided in the space in which the resonator 10 is accommodated to perform the oven control. For example, the heater circuit 22 may be provided between the step portion of the base 16 and the resonator 10, and heat generated by the heater circuit 22 may be directly transmitted to the resonator 10.

As described above, an oscillator according to the present embodiment includes: a resonator; an oscillation circuit configured to oscillate the resonator; a first temperature compensation circuit configured to perform a first temperature compensation processing of temperature-compensating for a frequency of a first clock signal generated by oscillation of the resonator by the oscillation circuit; and a second temperature compensation circuit configured to receive the first clock signal subjected to the first temperature compensation processing, and to output a second clock signal subjected to a second temperature compensation processing based on the first clock signal. The first temperature compensation circuit is configured to perform a first-order first temperature compensation processing as the first temperature compensation processing. The second temperature compensation circuit is configured to perform a high-order second temperature compensation processing as the second temperature compensation processing.

In the present embodiment, the first clock signal is generated by the oscillation of the resonator by the oscillation circuit, and the first temperature compensation circuit performs the first temperature compensation processing of temperature-compensating for the frequency of the first clock signal. Then, the second temperature compensation circuit receives the first clock signal subjected to the first temperature compensation processing, and the second temperature compensation circuit outputs the second clock signal subjected to the second temperature compensation processing based on the first clock signal. In the present embodiment, the first temperature compensation circuit performs the first-order first temperature compensation processing and does not need to perform the high-order first temperature compensation processing. Therefore, noise caused by the high-order first temperature compensation processing can be reduced, and deterioration in noise characteristics can be prevented. On the other hand, since the second temperature compensation circuit performs the high-order second temperature compensation processing, it is possible to temperature-compensate for the remaining high-order frequency-temperature characteristics that cannot be temperature-compensated by the first-order first temperature compensation processing of the first temperature compensation circuit. Therefore, it is possible to provide an oscillator capable of improving the frequency-temperature characteristics and reducing the noise.

In the present embodiment, the first temperature compensation circuit may perform the first-order first temperature compensation processing as the first temperature compensation processing in a first mode, and may perform the first-order first temperature compensation processing and a high-order first temperature compensation processing as the first temperature compensation processing in a second mode.

In this way, when the priority is given to the reduction of the phase noise, the oscillator can be set to the first mode to deal with. When the priority is given to the improvement in the frequency-temperature characteristics, the oscillator can be set to the second mode to deal with.

In the present embodiment, the oscillator may be set to the first mode when the oscillator is used as a oven controlled oscillator that controls a temperature of the resonator.

In this way, when the oscillator is used as the oven controlled oscillator that controls the temperature of the resonator, by setting the mode to the first mode, the frequency-temperature characteristics can be improved and the noise characteristics can also be improved.

In the present embodiment, the oscillator may be set to the first mode or the second mode when the oscillator is used as a temperature compensated oscillator that does not control a temperature of the resonator.

In this way, in the case where the oscillator is used as the temperature compensated oscillator that does not control the temperature of the resonator, when the priority is given to the improvement in the noise characteristics, the oscillator can be set to the first mode to deal with; when the priority is given to the improvement in the frequency-temperature characteristics, the oscillator can be set to the second mode to deal with.

In the present embodiment, the oscillation circuit may include a variable capacitance circuit. The first temperature compensation circuit may output, to the variable capacitance circuit, a temperature compensation voltage based on a temperature detection result of a temperature sensor.

In this way, the first temperature compensation processing is implemented by variably adjusting the capacitance of the variable capacitance circuit based on the temperature compensation voltage from the first temperature compensation circuit.

In the present embodiment, a capacitance sensitivity of the variable capacitance circuit with respect to the temperature compensation voltage may be set to be lower in the first mode than in the second mode.

In this way, when the capacitance sensitivity of the variable capacitance circuit is set to a low sensitivity in the first mode, it is possible to prevent the variation in the oscillation frequency due to the noise due to the amplification of the noise of the circuit elements and the like constituting the first temperature compensation circuit.

In the present embodiment, the first temperature compensation circuit may temperature-compensate for a frequency-temperature characteristic of a circuit element of the oscillation circuit by the first-order first temperature compensation processing.

In this way, the first-order frequency-temperature characteristics of the first clock signal caused by the frequency-temperature characteristics of the circuit elements of the oscillation circuit are temperature-compensated by the first-order first temperature compensation processing of the first temperature compensation circuit, and the frequency variation due to the temperature variation can be reduced.

In the present embodiment, the second temperature compensation circuit may temperature-compensate for a frequency-temperature characteristic of the resonator by the high-order second temperature compensation processing.

In this way, when the resonator has high-order frequency-temperature characteristics, the high-order frequency-temperature characteristics are temperature-compensated by the high-order second temperature compensation processing of the second temperature compensation circuit, and the frequency variation due to the temperature variation can be reduced.

In the present embodiment, the second temperature compensation circuit may include a fractional-N type PLL circuit configured to multiply a frequency of the first clock signal to generate the second clock signal.

In this way, the division ratio setting signal subjected to the second temperature compensation processing is set in the division circuit of the PLL circuit, and the second clock signal based on the signal obtained by multiplying the frequency of the first clock signal can be generated, and the second clock signal subjected to the second temperature compensation processing can be generated based on the first clock signal.

In the present embodiment, a first circuit device including the oscillation circuit and the first temperature compensation circuit and a second circuit device including the second temperature compensation circuit may be included.

In this way, when the first circuit device that oscillates the resonator performs the first temperature compensation processing, the frequency variation amount in the frequency-temperature characteristics of the first clock signal output from the first circuit device can be reduced. Further, by performing the second temperature compensation processing by the second circuit device after the first temperature compensation processing is performed by the first circuit device, it is possible to improve accuracy of the clock frequency.

In the present embodiment, a first package in which the resonator and the first circuit device are accommodated and a second package in which the first package and the second circuit device are accommodated may be included.

In this way, when the resonator and the first circuit device are accommodated in the first package, heat transmission from a heat source outside the first package, such as the second circuit device, can be thermally blocked by the first package, and an adverse effect of the heat from the heat source outside the first package on the temperature measurement can be reduced.

In the present embodiment, a heater circuit configured to keep a temperature of the resonator constant may be included.

In this way, the temperature compensation processing can be performed with the temperature of the resonator kept constant by the heater circuit, so that the frequency-temperature characteristics are improved and the frequency change in the operating temperature range can be reduced.

In the present embodiment, the second circuit device may include a heater control circuit configured to perform heater control on the heater circuit.

In this way, by providing the heater control circuit in the second circuit device, the oven control in, for example, a oven controlled oscillator that controls the temperature of the resonator, becomes possible by the heater control on the heater circuit by the heater control circuit.

In the present embodiment, the second circuit device may include a jitter cleaning circuit configured to perform jitter cleaning on the second clock signal.

By providing such a jitter cleaning circuit, the floor noise can be reduced, and the characteristics of the phase noise can be improved.

Although the present embodiment has been described in detail above, it will be easily understood by a person skilled in the art that many modifications can be made without substantially departing from the novel matters and effects of the present disclosure. Therefore, all such modifications are intended to be included within the scope of the present disclosure. For example, a term cited with a different term having a broader meaning or the same meaning at least once in the specification or in the drawings can be replaced with the different term at any place in the specification or in the drawings. All combinations of the present embodiment and the modifications are also included within the scope of the present disclosure. The configuration, operation, and the like of the oscillator are not limited to those described in the present embodiment, and various modifications can be made.

What is claimed is:

1. An oscillator comprising:
 a resonator;
 an oscillation circuit configured to oscillate the resonator;
 a first temperature compensation circuit configured to perform a first temperature compensation processing of temperature-compensating for a frequency of a first clock signal generated by oscillation of the resonator by the oscillation circuit; and
 a second temperature compensation circuit configured to receive the first clock signal subjected to the first temperature compensation processing, and to output a second clock signal subjected to a second temperature compensation processing based on the first clock signal, wherein
 the first temperature compensation circuit is configured to:
  perform, in a first mode, a first-order first temperature compensation processing as the first temperature compensation processing; and
  perform, in a second mode, the first-order first temperature compensation processing and a high-order first temperature compensation processing as the first temperature compensation processing,
 the second temperature compensation circuit is configured to perform a high-order second temperature compensation processing as the second temperature compensation processing, and
 the oscillator is set to the first mode when the oscillator is used as an oven controlled oscillator that controls a temperature of the resonator.

2. The oscillator according to claim 1, wherein
 the oscillator is set to the first mode or the second mode when the oscillator is used as a temperature compensated oscillator that does not control a temperature of the resonator.

3. The oscillator according to claim 1, wherein
 the oscillation circuit includes a variable capacitance circuit, and
 the first temperature compensation circuit is configured to output, to the variable capacitance circuit, a temperature compensation voltage based on a temperature detection result of a temperature sensor.

4. The oscillator according to claim 3, wherein
 a capacitance sensitivity of the variable capacitance circuit with respect to the temperature compensation voltage is set to be lower in the first mode than in the second mode.

5. The oscillator according to claim 1, wherein
 the first temperature compensation circuit is configured to temperature-compensate for a frequency-temperature characteristic of a circuit element of the oscillation circuit by the first-order first temperature compensation processing.

6. The oscillator according to claim 1, wherein
 the second temperature compensation circuit is configured to temperature-compensate for a frequency-temperature characteristic of the resonator by the high-order second temperature compensation processing.

7. The oscillator according to claim 1, wherein
 the second temperature compensation circuit includes a fractional-N type PLL circuit configured to multiply a frequency of the first clock signal to generate the second clock signal.

8. The oscillator according to claim 1, further comprising:
 a first circuit device including the oscillation circuit and the first temperature compensation circuit; and
 a second circuit device including the second temperature compensation circuit.

9. The oscillator according to claim 8, further comprising:
 a first package in which the resonator and the first circuit device are accommodated; and a second package in which the first package and the second circuit device are accommodated.

10. The oscillator according to claim 8, further comprising:
a heater circuit configured to keep a temperature of the resonator constant.

11. The oscillator according to claim 10, wherein
the second circuit device includes a heater control circuit configured to perform heater control on the heater circuit.

12. The oscillator according to claim 8, wherein
the second circuit device includes a jitter cleaning circuit configured to perform jitter cleaning on the second clock signal.

13. An oscillator comprising:
a resonator;
an oscillation circuit configured to oscillate the resonator;
a first temperature compensation circuit configured to perform a first temperature compensation processing of temperature-compensating for a frequency of a first clock signal generated by oscillation of the resonator by the oscillation circuit; and
a second temperature compensation circuit configured to receive the first clock signal subjected to the first temperature compensation processing, and to output a second clock signal subjected to a second temperature compensation processing based on the first clock signal, wherein
the first temperature compensation circuit is configured to perform a first-order first temperature compensation processing as the first temperature compensation processing,
the second temperature compensation circuit is configured to perform a high-order second temperature compensation processing as the second temperature compensation processing,
the oscillator circuit is configured to output only the second clock signal as an output clock signal of the oscillator,
the first temperature compensation circuit is configured to
perform, in a first mode, the first-order first temperature compensation processing as the first temperature compensation processing, and
perform, in a second mode, the first-order first temperature compensation processing and a high-order first temperature compensation processing as the first temperature compensation processing, and
the oscillator is set to the first mode when the oscillator is used as an oven controlled oscillator that controls a temperature of the resonator.

14. The oscillator according to claim 13, wherein
the oscillator is set to the first mode or the second mode when the oscillator is used as a temperature compensated oscillator that does not control a temperature of the resonator.

15. An oscillator comprising:
a resonator;
a first circuit device including:
an oscillation circuit configured to oscillate the resonator; and
a first temperature compensation circuit configured to perform a first temperature compensation processing of temperature-compensating for a frequency of a first clock signal generated by oscillation of the resonator by the oscillation circuit;
a second circuit device including:
a second temperature compensation circuit configured to receive the first clock signal subjected to the first temperature compensation processing, and to output a second clock signal subjected to a second temperature compensation processing based on the first clock signal;
a first package in which the resonator and the first circuit device are accommodated; and
a second package in which the first package and the second circuit device are accommodated, wherein
the first temperature compensation circuit is configured to perform a first-order first temperature compensation processing as the first temperature compensation processing,
the second temperature compensation circuit is configured to perform a high-order second temperature compensation processing as the second temperature compensation processing,
the first temperature compensation circuit is configured to
perform, in a first mode, the first-order first temperature compensation processing as the first temperature compensation processing, and
perform, in a second mode, the first-order first temperature compensation processing and a high-order first temperature compensation processing as the first temperature compensation processing, and
the oscillator is set to the first mode when the oscillator is used as an oven controlled oscillator that controls a temperature of the resonator.

* * * * *